US010558125B2

(12) United States Patent
Moriya et al.

(10) Patent No.: US 10,558,125 B2
(45) Date of Patent: Feb. 11, 2020

(54) EXPOSURE APPARATUS, EXPOSURE APPARATUS ADJUSTMENT METHOD AND STORAGE MEDIUM

(71) Applicant: Tokyo Electron Limited, Tokyo (JP)

(72) Inventors: Teruhiko Moriya, Koshi (JP); Masaru Tomono, Koshi (JP); Ryo Shimada, Koshi (JP); Makoto Hayakawa, Koshi (JP); Seiji Nagahara, Tokyo (JP)

(73) Assignee: Tokyo Electron Limited, Minato-Ku (JP)

(*) Notice: Subject to any disclaimer, the term of this patent is extended or adjusted under 35 U.S.C. 154(b) by 0 days.

(21) Appl. No.: 15/813,464

(22) Filed: Nov. 15, 2017

(65) Prior Publication Data
US 2018/0136567 A1    May 17, 2018

(30) Foreign Application Priority Data

Nov. 17, 2016 (JP) ................................. 2016-224248
Aug. 21, 2017 (JP) ................................. 2017-158737

(51) Int. Cl.
*G03F 7/20* (2006.01)

(52) U.S. Cl.
CPC ........ *G03F 7/70208* (2013.01); *G03F 7/7055* (2013.01); *G03F 7/7085* (2013.01); *G03F 7/70725* (2013.01); *G03F 7/70775* (2013.01)

(58) Field of Classification Search
CPC .. G03F 7/7055; G03F 7/70558; G03F 7/2022; G03F 7/70133; G03F 7/20; G03F 7/7005; G03F 7/70391
See application file for complete search history.

(56) References Cited

U.S. PATENT DOCUMENTS 5,581,075 A * 12/1996 Naraki ................. G03F 7/7005
                                                        250/205
5,898,480 A    4/1999 Ozawa
7,573,054 B2 * 8/2009 Iwashita ............... G03F 7/2022
                                                        250/559.36
(Continued)

FOREIGN PATENT DOCUMENTS

DE    10 2011 088 152 A1    6/2013
EP         1 796 142 A1    6/2007
(Continued)

OTHER PUBLICATIONS

European Search Report (Application No. 17202294.9) dated Apr. 4, 2018.

*Primary Examiner* — Steven Whitesell Gordon
(74) *Attorney, Agent, or Firm* — Burr & Brown, PLLC

(57) ABSTRACT

An exposure apparatus includes a stage on which a substrate is placed, a plurality of light irradiation units configured to emit light independently of each other to different positions in a right and left direction on a surface of the substrate, so as to form a strip-like irradiation area extending from one end of the surface of the substrate to the other end of the substrate, a stage moving mechanism configured to move the stage in a back and forth direction relative to the irradiation area, such that the whole surface of the substrate is exposed, and a light receiving unit configured move in the irradiation area between one end and the other end of the irradiation area in order to detect an illuminance distribution of the irradiation area in a longitudinal direction of the irradiation area.

20 Claims, 32 Drawing Sheets

(56) References Cited

U.S. PATENT DOCUMENTS

| | | | |
|---|---|---|---|
| 2003/0025890 A1* | 2/2003 | Nishinaga | G03B 27/42 355/53 |
| 2006/0274297 A1* | 12/2006 | Ogusu | G03F 7/70341 355/71 |
| 2009/0161088 A1 | 6/2009 | Hansen et al. | |
| 2012/0164585 A1* | 6/2012 | Ikeda | G03F 7/70425 430/325 |
| 2014/0063479 A1 | 3/2014 | Komine | |
| 2014/0084184 A1* | 3/2014 | Honjo | H01L 21/268 250/492.2 |
| 2016/0291480 A1* | 10/2016 | Kaiser | G03F 7/70191 |
| 2016/0327869 A1 | 11/2016 | Nagahara et al. | |

FOREIGN PATENT DOCUMENTS

| | | |
|---|---|---|
| EP | 1 868 034 A1 | 12/2007 |
| JP | 2014-049611 A | 3/2014 |
| JP | 2015-118219 A | 6/2015 |
| JP | 2015-156472 A1 | 8/2015 |
| WO | 2008/089898 A1 | 7/2008 |

\* cited by examiner

EXPOSURE APPARATUS, EXPOSURE APPARATUS ADJUSTMENT METHOD AND STORAGE MEDIUM

CROSS REFERENCE TO RELATED APPLICATIONS

This application is based upon and claims the benefit of priority from Japanese Patent Application No. 2016-224248, filed on Nov. 17, 2016, and Japanese Patent Application No. 2017-158737, filed on Aug. 21, 2017, the entire contents of which are incorporated herein by reference.

FIELD OF THE INVENTION

The present invention relates to a technique of exposing the whole surface of a substrate.

BACKGROUND ART

A manufacturing process of a semiconductor device may include a process that exposes the whole surface of a substrate, e.g., a semiconductor wafer (referred to as "wafer" herebelow). For example, JP2015-156472A (Patent Document 1) describes that a resist film made of a photosensitized chemically amplified resist is formed on a surface of a wafer, the resist film is exposed with the use of a pattern mask (pattern exposure), and then the whole surface of the wafer is exposed (flood exposure). By the flood exposure, acid increases in areas of the resist film subjected to the pattern exposure. Thereafter, the wafer is subjected to a heating process and a developing process so that the aforementioned areas are dissolved and a resist pattern is thus formed.

The exposure of the whole surface of the wafer is performed by moving the wafer in a back and forth direction below an LED array comprising a plurality of laterally-arrayed LEDs (light-emitting diodes) each configured to emit light downward. Japanese patent laid-open Publication No. JP2015-156472A discloses an exposure apparatus having such a structure. The LEDs are deteriorated with the lapse of the use time so that the exposure amounts in respective portions of the wafer decrease gradually. If the currents supplied to the LEDs are kept constant, it is possible that a desired processing result cannot be achieved. For example, the CD (Critical Dimension) of a resist pattern may be non-uniform in a plane of the wafer, in the case where the whole surface of the wafer is exposed to generate acid in the resist film as mentioned above. JP2015-156472A does not describe any solution to this problem.

SUMMARY OF THE INVENTION

The object of the present invention is to provide an exposure technique for exposing the whole surface of a substrate, which is capable of exposing respective areas in a plane of the substrate at suitable exposure amounts.

In one embodiment of the present invention, there is provided an exposure apparatus that includes: a stage on which a substrate is placed; a plurality of light irradiation units configured to emit light independently of each other to different positions in a right and left direction on a surface of the substrate, so as to form a strip-like irradiation area extending from one end of the surface of the substrate to the other end of the substrate; a stage moving mechanism configured to move the stage in a back and forth direction relative to the irradiation area, such that the whole surface of the substrate is exposed; and a light receiving unit configured move in the irradiation area between one end and the other end of the irradiation area in order to detect an illuminance distribution of the irradiation area in a longitudinal direction of the irradiation area.

In another embodiment of the present invention, there is provided an exposure apparatus adjustment method that includes: a step that places a substrate on a stage; a step that makes a plurality of light irradiation units emit light independently of each other to different positions in a right and left direction on a surface of the substrate, so as to form a strip-like irradiation area extending from one end of the surface of the substrate to the other end of the substrate; a step that moves the stage in a back and forth direction relative to the irradiation area by means of a stage moving mechanism such that the whole surface of the substrate is exposed; a step that moves a light receiving unit between one end and the other end of the irradiation area to allow the light receiving unit to receive the light, in order to detect an illuminance distribution of the irradiation area in a longitudinal direction of the irradiation area; and a step that adjusts a light quantity emitted from each of the light irradiation units for exposing the substrate, based on the illuminance distribution thus detected.

In yet another embodiment of the present invention, there is provided a non-transitory storage medium storing a computer program for use in an exposure apparatus for exposing a substrate, wherein the computer program includes steps for executing the aforementioned exposure apparatus adjustment method.

According to the above embodiments of the present invention, the plurality of the light irradiation units form the strip-like irradiation area extending from the right end to the left end of the substrate that moves in the back and forth direction. The light receiving unit receives light while moving from one end to the other end of the irradiation area, whereby the illuminance distribution of the irradiation area in the longitudinal direction thereof can be detected. Thus, by using the detection result, deviation of the exposure amounts in respective portions in the substrate from the predetermined value can be prevented, and occurrence of trouble in the substrate can be prevented.

DETAILED DESCRIPTION OF THE INVENTION ( First Embodiment )

Figure 1:
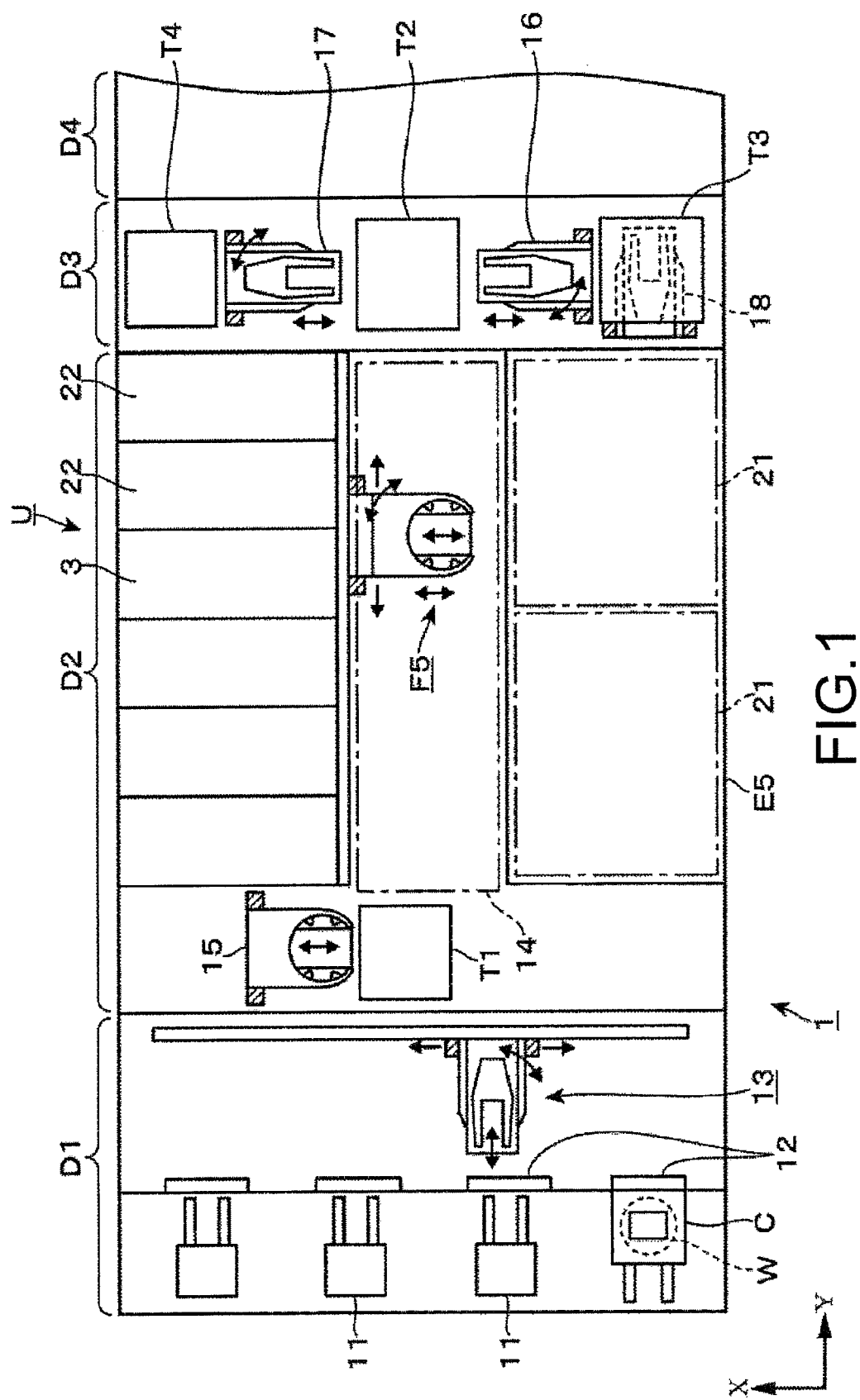
FIG. 1 is a plan view of a coating and developing apparatus to which an exposure apparatus of the present invention is applied.

In the following description of all of the embodiments, identical or similar elements are denoted by the same reference sign. First, the description is made to the entire structure of a coating and developing apparatus 1 with reference to FIGS. 1 and 2, which are a plan view and a schematic vertically-sectioned side view of the apparatus 1, respectively. The coating and developing apparatus 1 is formed by horizontally and linearly connecting a carrier block D1, a processing block D2 and an interface block D3. For the sake of convenience, the direction in which these blocks D1 to D3 are arranged is referred to as Y direction, and a horizontal direction perpendicular to Y direction is referred to as X direction. An exposure apparatus D4 is connected to the interface block D3. The carrier block D1 has stages 11 on each of which a carrier C is placed. The carrier C can accommodate circular wafers W (i.e., substrate (s)) of a 300 mm diameter, for example. In FIG. 1, reference sign 12 depicts an opening and closing unit, and reference sign 13 depicts a transfer mechanism for transporting the wafer W between the carriers C and the processing block D2.

The processing block D2 is formed by stacking unit blocks E1 to E6 in this order from below. Each of the unit blocks E1 to E6 is configured to perform a liquid treatment to the wafer W. In these unit blocks E1 to E6, wafers W are transported and processed in parallel. The unit blocks E1 and E2 have the same structure, the unit blocks E3 and E4 have the same structure, and the unit blocks E5 and E6 have the same structure.

The unit block E5 is described as a representative with reference to FIG. 1. A transport area 14 extends from the carrier block D1 toward the interface block D3. A plurality of shelf units U are arranged side by side in the back and forth direction on one side of the transport area 14 with respect to the X direction, while two developing modules 21 are arranged side by side in the Y direction on the other side of the transport area 14. Each developing module 21 supplies a developer to a resist film formed on the surface of the wafer W. The shelf unit U includes heating modules 22 each for heating the wafer W, and flood exposure modules 3. The flood exposure module 3 is an exposure apparatus in one embodiment of the present invention. The flood exposure module 3 exposes the whole surface of the wafer W. In this specification, exposure of the whole surface is referred to as flood exposure. The detailed structure of the flood exposure module 3 is described later. The transport area 14 is provided with a transport arm F5 (i.e., a wafer transport mechanism). Wafers W are transported among the modules provided in the unit block E5, and modules in towers T1 and T2 (described later) located at a level of the unit block E5.

Figure 2:
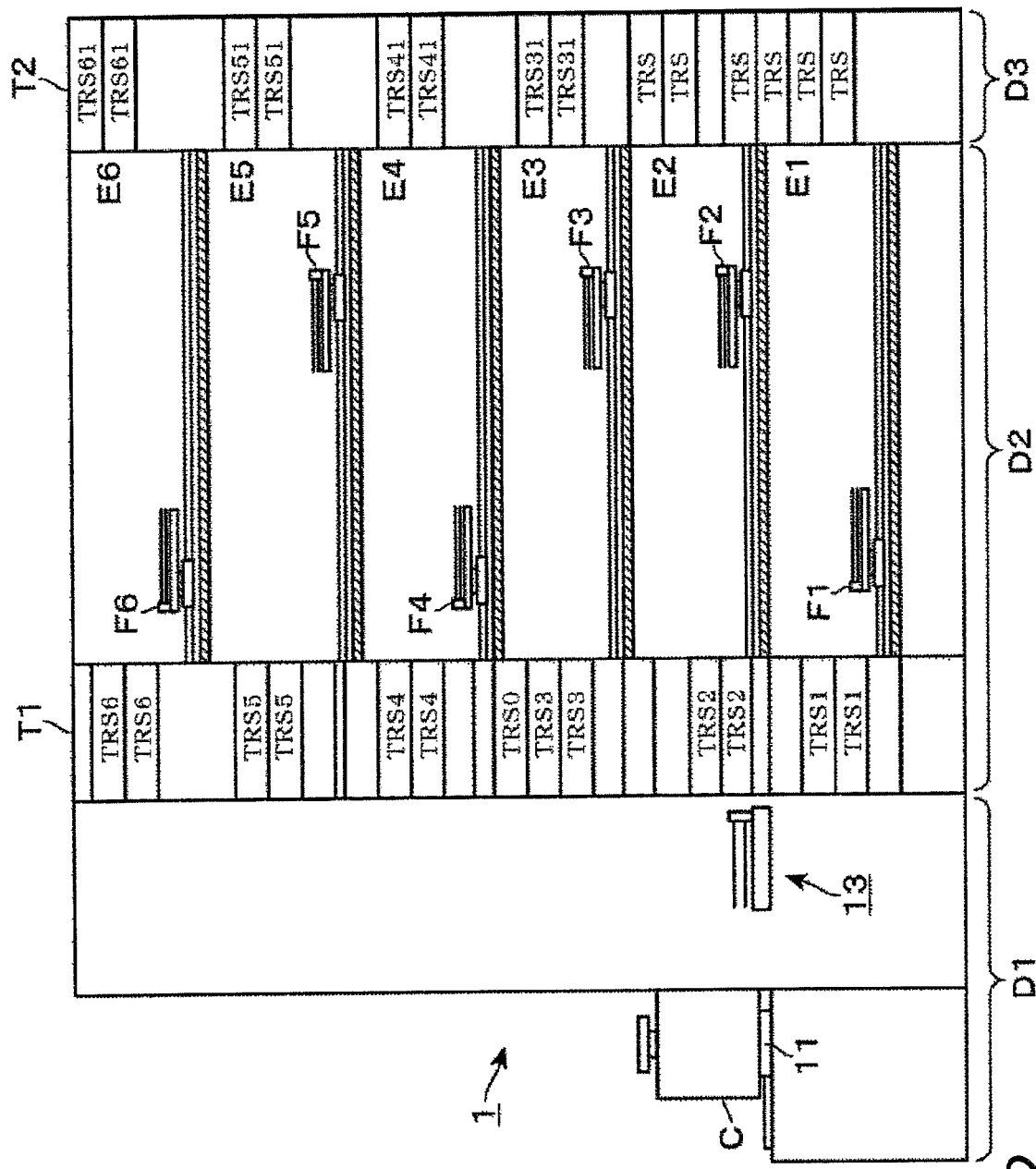
FIG. 2 is a vertically-sectioned side view of the coating and developing apparatus.

The unit blocks E1 to E4 have the same structure as that of the unit blocks E5 and E6, excluding that different chemical liquids are supplied to wafers W. The unit blocks E1 and E2 each include, instead of the developing modules 21, antireflection film forming modules that each supply the wafer W with a chemical liquid for forming an antireflection film. The unit blocks E3 and E4 each include, instead of the developing modules 21, resist film forming modules that each form a resist film by supplying the wafer W with a resist called "photosensitized chemically amplified resist". In FIG. 2, transport arms in the unit blocks E1 to E6 are depicted by reference signs F1 to F6, respectively.

On the carrier block D1 side in the processing block D2, there are disposed the tower T1 vertically extending across the unit blocks E1 to E6, and a transfer arm 15 that is a vertically-movable transfer mechanism for transferring the wafer W to the tower T1. The tower T1 is formed of a plurality of modules, stacked one on another, including transfer modules TRS on each of which the wafer W is to be placed.

The interface block D3 includes towers T2, T3 and T4 vertically extending across the unit blocks E1 to E6, and includes an interface arm 16 that is a vertically-movable transfer mechanism for transferring the wafer W to the tower T2 and the tower T3, an interface arm 17 that is a vertically-movable transfer mechanism for transferring the wafer W to the tower T2 and the tower T4, and an interface arm 18 for transferring the wafer W between the tower T2 and the exposure apparatus D4. The exposure apparatus D4 exposes the surface of the wafer W with extreme ultraviolet (EUV), for example, using a pattern mask. In other words, unlike the flood exposure module 3, the exposure apparatus D4 exposes only parts of the surface of the wafer W. In order to discriminate the exposure by the exposure apparatus 4 from the flood exposure by the flood exposure module 3, the former is sometimes referred to as "pattern exposure".

Although the tower T2 is formed by stacking one on another the transfer modules TRS, a buffer module(s) in which a plurality of unexposed wafers W are stored, and a temperature adjusting module(s) SCPL that adjusts the temperature of the wafer W, and so on. Illustration of the buffer module(s) and the temperature adjusting module(s) are omitted in the attached drawings. Although towers T3 and T4 have modules, description thereof is omitted.

A transport route of the wafer W in the system composed of the coating and developing apparatus 1 and the exposure apparatus D4 is described. The wafer W is transported by the transfer mechanism 13 from the carrier 11 to the transfer module TRS0 of the tower T1 in the processing block D2. From the transfer module TRS0, the wafer W is transported to one of the unit blocks E1 or E2 allocated to that wafer W. For example, if the wafer W is to be transported to the unit block E1, the wafer W is transferred from the transfer module TRS0 to a transfer module TRS1 (this is a transfer module to and from which the transport arm F1 can transfer the wafer W, and which corresponds to the unit block E1) among the transfer modules TRS in the tower T1. On the other hand, if the wafer W is to be transferred to the unit block E2, the wafer W is transferred from the TRS0 to a transfer module TRS2, corresponding to the unit block E2, among the transfer modules TRS in the tower T1. The aforementioned transferring of the wafer W is carried out by the transfer arm 15.

The wafer W thus transferred as described above is transported from the transfer module TRS1 (or TRS2), to the antireflection film forming module, to the heating module, and to the transfer module TRS1 (or TRS2) in this order. Following thereto, the wafer W is transported by the transfer arm 15 to one of the transfer module TRS3 corresponding to the unit block E3 and the transfer module TRS4 corresponding to the unit block E4 allocated to that wafer W.

The wafer W transferred to the transfer module TRS3 or TRS4 is transported from the transfer module TRS3 (TRS4) to the resist film forming module, in which a photosensitized chemically amplified resist is applied to the whole surface of the wafer W so as to form a resist film. Thereafter, the wafer W is transported to the heating module and to the transfer module TRS in the tower T2 in this order. After that, the wafer W is loaded into the exposure apparatus D4 by the interface arms 16 and 18 through the tower T3. Then, the resist film is subjected to pattern exposure, and acid and photosensitizer are generated in the exposed areas.

The wafer W having been subjected to the pattern exposure is transported between the towers T2 and T4 by the interface arms 16 and 17, and is transported to a transfer module TRS51 or TRS61 in the tower T2 corresponding to the unit block E5 or E6. Thereafter, the whole surface of the wafer W is exposed in the flood exposure module 3. Thus, the aforementioned photosensitizer absorbs light so that acid and photosensitizer are further generated in the areas exposed by the pattern exposure. Namely, the flood exposure increases the acid only in the areas exposed by the pattern exposure. Thereafter, the wafer W is transported to the heating module 22 to be heated therein, so that a so-called post exposure baking (PEB) is performed in the heating module 22.

The PEB alters the exposed areas by the pattern exposure so that those exposed areas become soluble in a developer by the acid. Then, the wafer W is transported to the developing module 21, in which the wafer W is supplied with a developer. The altered areas are dissolved in the developer, so that a resist pattern is formed. After that, the wafer W is transported to the transfer module TRS5 or TRS6 in the tower T1, and is then returned to the carrier C by the transfer mechanism 13.

Figure 3:
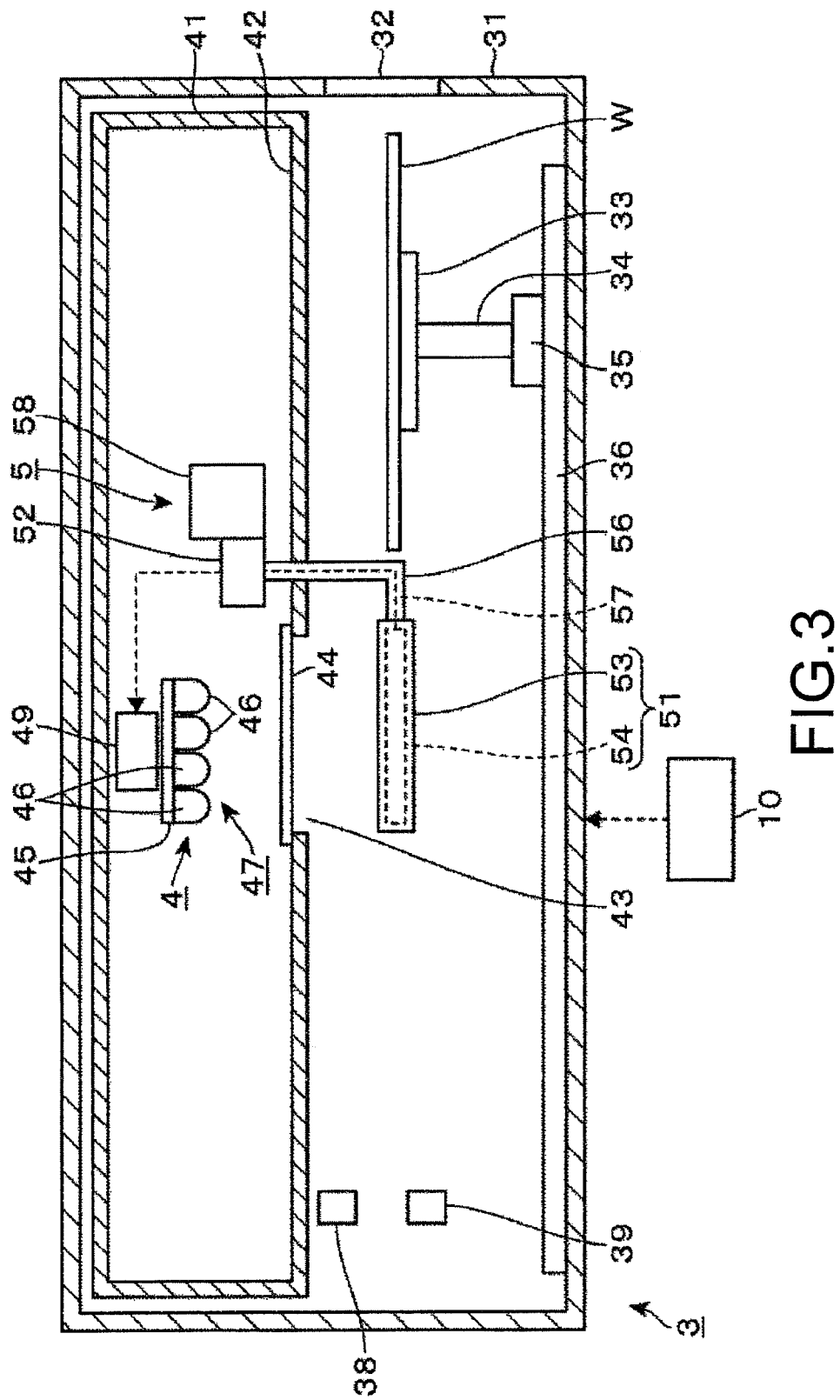
FIG. 3 is a vertically-sectioned side view of a flood exposure module in a first embodiment.
Figure 4:
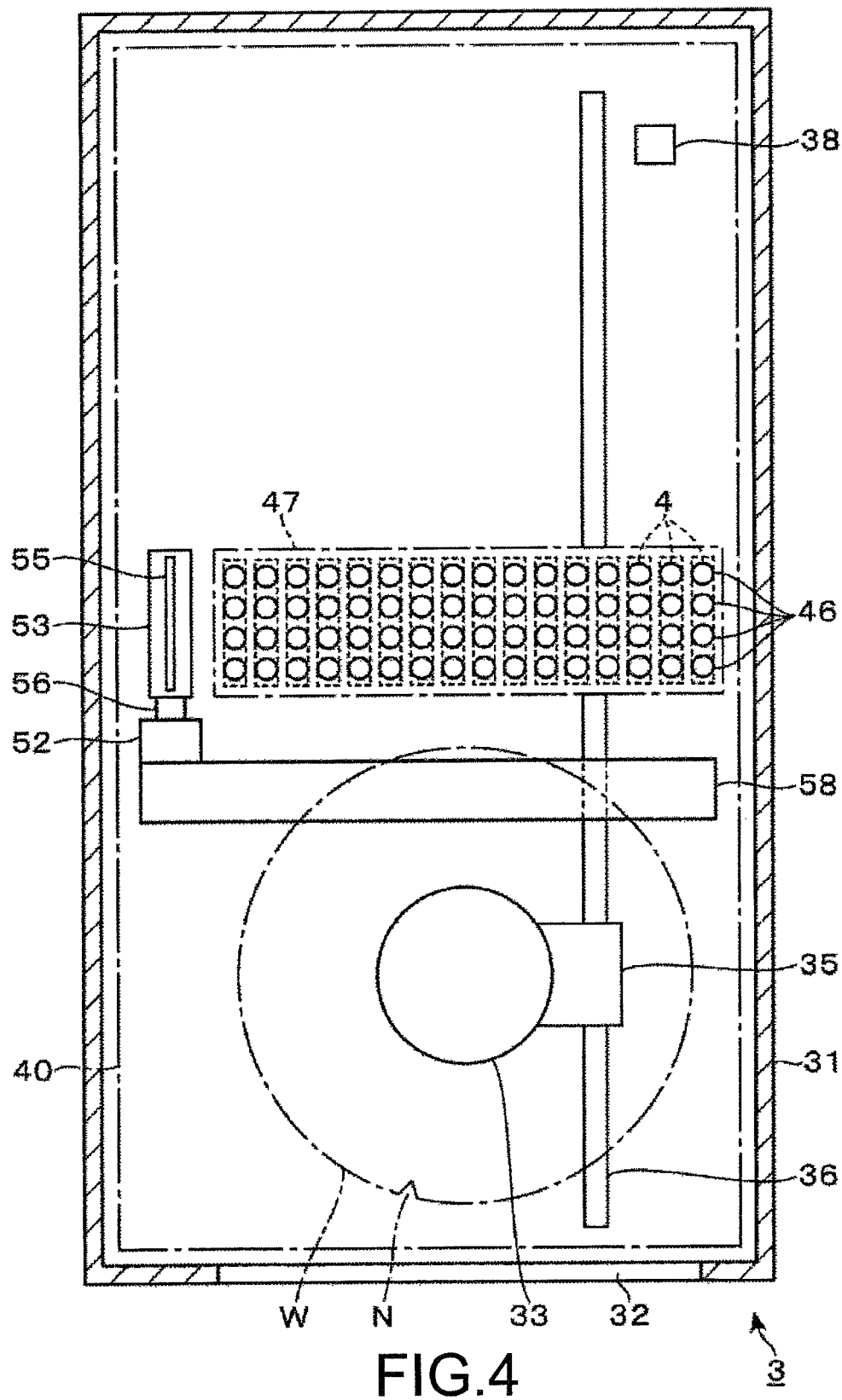
FIG. 4 is a laterally-sectioned plan view of the flood exposure module.

Next, the flood exposure module 3 disposed in the unit block E5 is described with reference to FIG. 3 which is a vertically-sectioned side view, and FIG. 4 which is a laterally-sectioned plan view. In FIGS. 3 and 4, reference sign 31 depicts a housing. A transport opening 32 for the wafer W is opened in a sidewall of the housing 31. A circular stage 33 for placing thereon the wafer W in horizontal posture is disposed in the housing 31. The aforementioned transport arm F5 transfers the wafer W to the stage 33 such that their central axes are aligned with each other. The stage 33 holds the wafer W placed thereon by suction. In FIGS. 3 and 4, reference sign 34 depicts a rotation mechanism provided below the stage 33, which rotates the stage 33 such that the wafer W placed on the stage 33 is rotated about the central axis. In FIGS. 3 and 4, reference sign 35 depicts a support table which supports the rotation mechanism 34 from below. In FIGS. 3 and 4, reference sign 36 depicts a stage moving mechanism including a motor and a ball screw. The ball screw is rotated by the motor, so that the support table 35 connected to the ball screw is horizontally moved together with the stage 33 in the back and forth direction.

By the movement of the support table 35, the stage 33 is moved between a transfer position, which is relatively close to the transport opening 32 in the housing 31, and an orientation adjustment position, which is relatively distantly apart from the transport opening 32 in the housing 31. At the transfer position, the wafer W is transferred to and from the stage 33 by the transport arm F5. At the orientation adjustment position, the orientation of the wafer W is adjusted, which will be described later. FIGS. 3 and 4 show the stage 33 located at the transfer position. In the below description, for the purpose of indicating the moving direction of the stage 33, the side of the transfer position is referred to as "front side (forth, forward)", and the side of the orientation adjustment position is referred to as "rear side (back, backward)".

On the rear side in the housing 31, a light emitting unit 38 and a light receiving unit 39 are disposed, which form a detection mechanism for detecting a notch N that is a cutout formed in the periphery of the wafer W. The light emitting unit 38 and the light receiving unit 39 are positioned such that the peripheral part of the wafer W, which is placed on the stage 33 located at the orientation adjustment position, is sandwiched between these units 38 and 39 in the vertical direction. During the rotation of the wafer W by the stage 33, light is emitted from the light emitting unit 38 to the light receiving unit 39. Based on the change in amount of light received by the light receiving unit 39, a control unit 10 (described later) detects the notch N. The orientation of the wafer W is adjusted by the stage 33 and the rotation mechanism 34 such that the detected notch N is directed in a predetermined orientation.

A light source unit 40 is disposed above a wafer moving path along which the wafer W is moved by the stage moving mechanism 36. The light source unit 40 includes a case body 41, a shutter 44, an LED group (a group of LEDs) 47, a support board 45, a control board 49, and an illuminance distribution detection unit 5. A lower part of the case body 41 is formed as a horizontal plate 42 that covers, from above, the wafer moving path along which the wafer W is moved by the stage moving mechanism 36 in the back and forth direction. An exposure opening 43 extending in the right and left direction is formed in a central part of the horizontal plate 42 with respect to the back and forth direction. The shutter 44 is disposed on the horizontal plate 42. The shutter 44 is moved, by a not-shown moving mechanism provided in the case body 41, between a close position at which the shutter 44 closes the exposure opening 43, and an open position at which the shutter 44 opens the exposure opening 43. The open position of the shutter 44 is located on the rear side of the close position.

Figure 5:
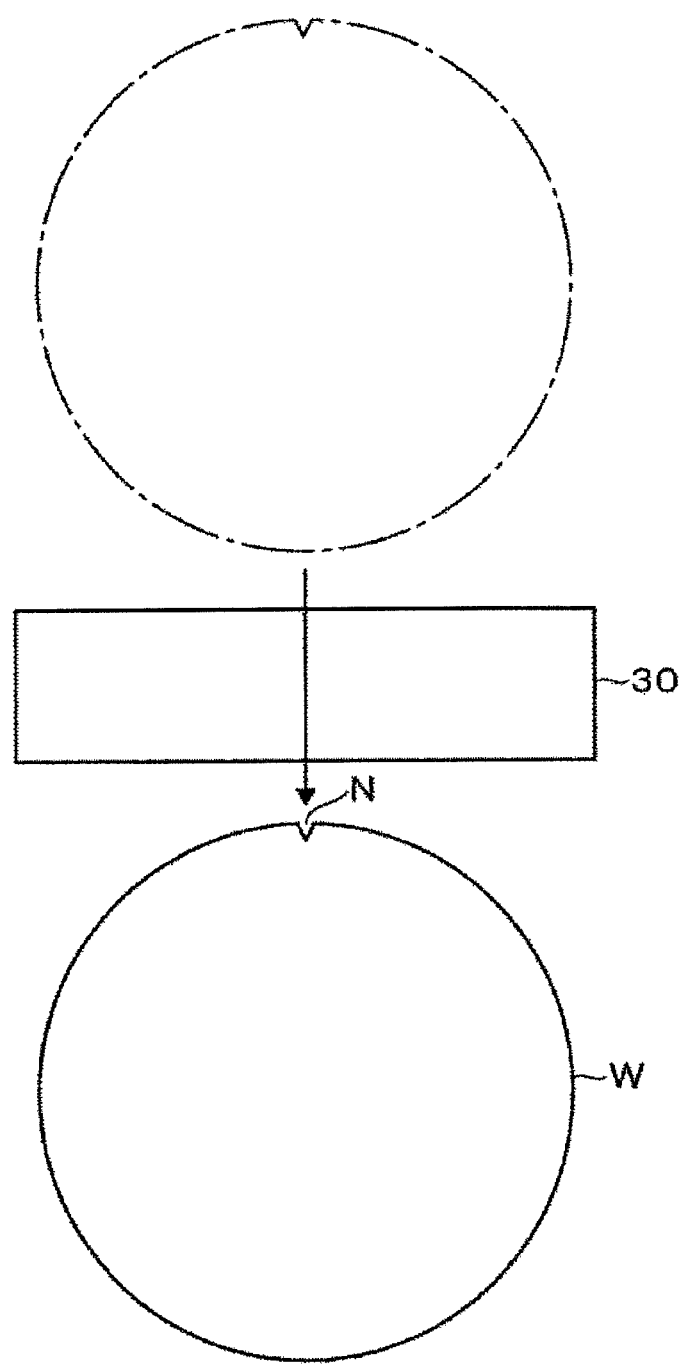
FIG. 5 is a schematic view of an irradiation area formed by the flood exposure module.

In the case body 41, the support board 45 is disposed above the exposure opening 43 in a horizontal posture. A large number of LEDs (light-emitting diodes) 46 are supported on a lower surface of the support board 45, such that each LED 46 can emit downward ultraviolet light having a wavelength of, e.g., 365 nm. In the illustrated embodiment, the number of the LEDs 46 is 356 in total, and the LEDs 46 are arranged in a matrix of 4×89 (four rows/eighty-nine columns). The number of the LEDs 46 in the back and forth direction is 4, and the number of LEDs in the right and left direction is 89. However, for the simplicity of the drawing, FIG. 4 shows only 20 LEDs 46 arranged in the right and left direction. The LEDs 46 arranged in the matrix are collectively referred to as "LED group 47". Ultraviolet light emitted from the LED group 47 forms a strip-like ultraviolet irradiation area 30 formed at a height position of the surface of the wafer W placed on the stage 33 (in other words, the irradiation area 30 is formed on an imaginary horizontal plane including the surface of the wafer W placed on the stage 33). In addition, respective portions (subareas) of the irradiation area 30 in the right and left direction are irradiated with ultraviolet light from a plurality of cells 4 (subgroups of the LEDs 46). FIG. 5 shows the positional relationship between the irradiation area 30 and the wafer W moved by the stage 33. The longitudinal size of the irradiation area 30 is larger than the diameter of the wafer W. By moving the wafer W in the back and forth direction, the whole surface of the wafer W passes through the irradiation area 30, so that the whole surface is exposed.

Figure 6:
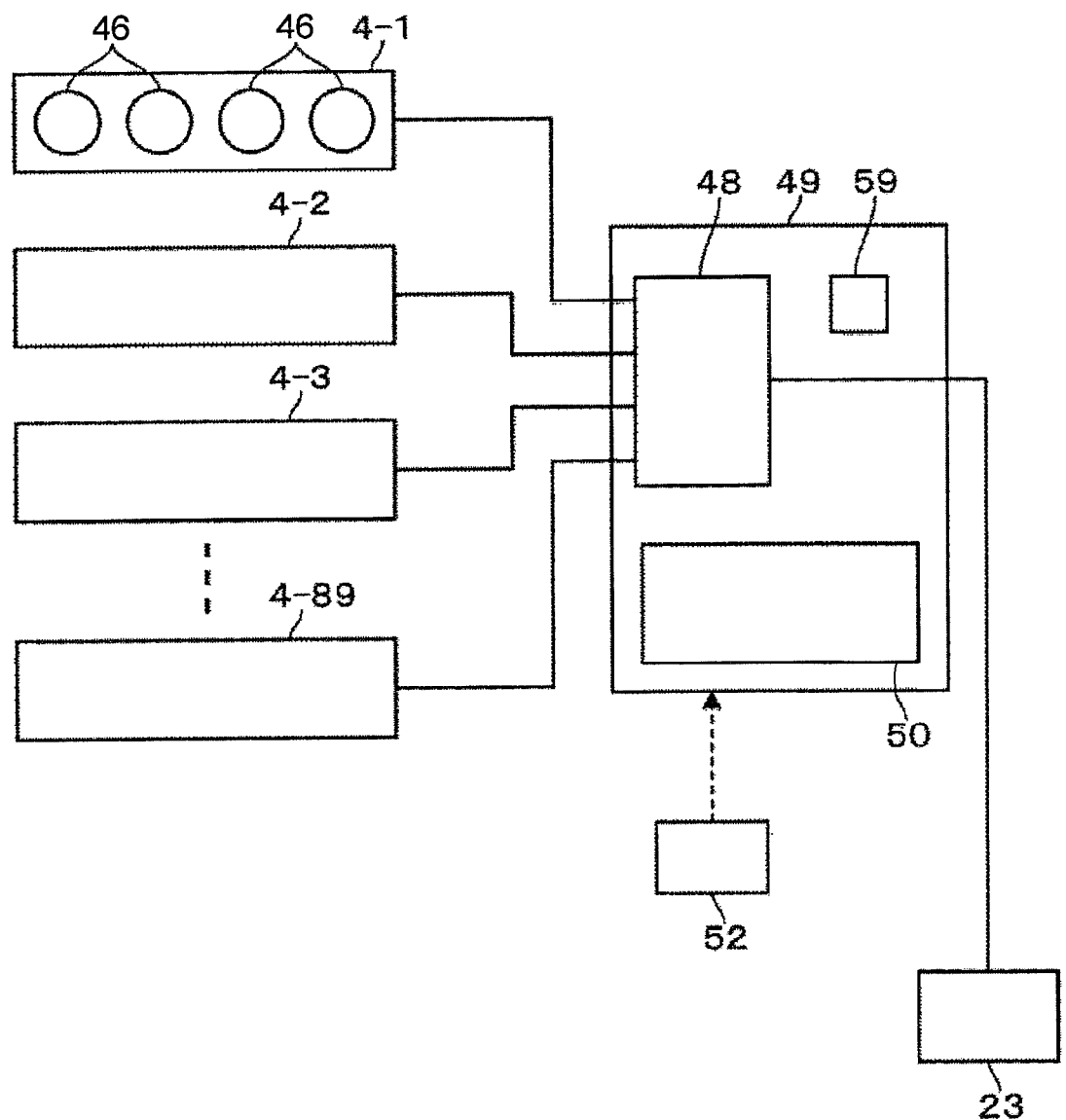
FIG. 6 is a block diagram showing the structure of cells provided in the flood exposure module.

In the LED group 47, four LEDs 46 arranged along a line extending in the back and forth direction are referred to as cell 4. In order to discriminate the cells 4 from one another, the identification number (1 to 89) indicating the position of the column of the matrix to which the cell 4 belongs may be connected to reference sign 4 with a hyphen, such as 4-1, 4-2, 4-3 . . . 4-89, as needed basis. The identification numbers of the cells 4 assigned sequentially from one side to the other side in the right and left direction. As shown in a block diagram of FIG. 6, the cells 4 are connected to a power source 23 through a current adjustment unit 48. The power source 23 may be provided outside the housing 31, for example. The current adjustment unit 48 adjusts currents supplied from the power source 23 to the LEDs 46 cell by cell. The illuminance of each portion (subarea) of the irradiation area 30 defined by dividing the irradiation area 30 in the right and left direction is adjusted by adjusting the current supplied to each cell 4. During the operation of the flood exposure module 3, light may be always emitted from the LED group 47 in one example. The current adjustment unit 48 may be disposed on the control board 49 located above the support board 45 in one example.

In the flood exposure performed by the flood exposure module 3, as the exposure amount increases, a larger amount of acid is generated in the areas, exposed by the pattern exposure, of the resist film on the surface of the wafer W, so that the CD (the dimension of the pattern) increases after development. Thus, in order to make uniform the CD in the plane of the wafer W, it is necessary to control the exposure amounts in the respective portions in the plane of the wafer W.

However, as described in the background art column, the light quantity outputted from the LED group 47 decreases due to deterioration of the LEDs 46 with the use time. If the currents supplied to the respective cells 4 are identical to each other, the exposure amounts varies among the respective portions in the plane of the wafer W due to variation in deterioration of the respective LEDs 46 forming the cells 4. In addition, in order to address the deterioration of the LEDs 46 by increasing the current supplied to the LEDs 46, each of the LEDs satisfies the condition that the desired illuminance is achieved when a current which is lower than the rated current (e.g., 75% of the rated current) is supplied to the new (not used) LED 46. However, the variation of the light quantities among the LEDs 46 increases if a current lower than the rated current is supplied to each of the LEDs 46. In addition, since the cells 4 are closely adjacent to each other, the junction temperatures of the cells 4 located in the central portion with respect to the right and left direction is higher than the other cells 4. Thus, the forward voltage of those LEDs 46 drops, resulting in decreasing of the light quantity.

For these reasons, the light quantity varies among the LEDs 46. This variation in the light quantities of the LEDs 46 may invite deviation of the exposure amounts in respective portions in the plane of the wafer W from a predetermined value. In order to prevent this, during a standby period in which exposure of the wafer W is not performed, the flood exposure module 3 performs detection of the illuminance distribution in the longitudinal direction of the irradiation area 30, and correction of a set value of the current to be supplied to each cell is performed based on the detection result.

In order to detect the illuminance distribution, the flood exposure module 3 is provided with the illuminance distribution detection unit 5. The illuminance distribution detection unit 5 includes a light guide unit 51, an illuminance sensor 52, an arm 56 and a moving mechanism 58. The light guide unit 51, which is a light receiving unit, receives ultraviolet light emitted from the cell 4 and guides the ultraviolet light to the illuminance sensor 52 in such a manner that the illuminance of the ultraviolet light does not lower. The illuminance sensor 52, which is an illuminance detection unit, is connected to the control board 49, and outputs a current (detection current), which corresponds to the illuminance of the guided light, to the control board 49. A photodiode having a relatively high response speed is used as the illuminance sensor 52, but a thermopile may be used instead.

Figure 7:
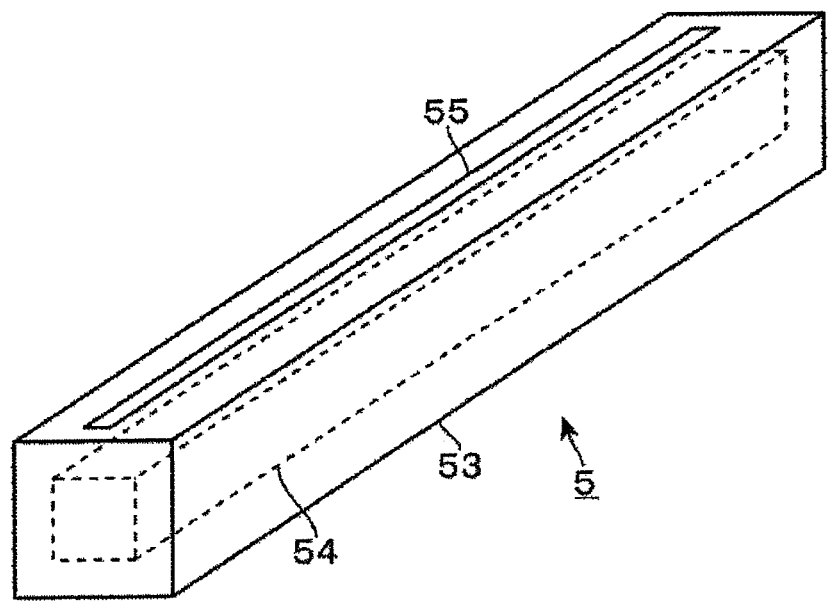
FIG. 7 is a perspective view of a light guide unit provided in the flood exposure module.

The light guide unit 51 is described with reference to FIG. 7 which is a perspective view, FIG. 8 which is a vertically-sectioned side view, and FIG. 9 which is a vertically-sectioned front view. The light guide unit 51 includes a sheath 53 and a fluorescent glass 54. The sheath 53 is disposed below the horizontal plate 42, and has a box-like shape elongate in the back and forth direction. The fluorescent glass 54 is formed in an elongate square bar, and is disposed in the sheath 53, with the longitudinal directions of the sheath 53 and the fluorescent glass 54 being identical with each other. A slit is formed in an upper part of the sheath 53 to extend in the back and forth direction. Ultraviolet light emitted from the cell reaches an upper surface of the horizontally-extending fluorescent glass 54 through the slit 55. The sheath 53 thus serves as a light shielding unit that partially shields light emitted from the cell 4. The width of the slit 55 (i.e., the short dimension of the slit 55 measured in a direction transverse to the longitudinal direction of the slit 55) may be 1 mm, for example.

The sheath 53 is connected to one end of the arm 56, and the other end of the arm 56 extends into the case body 41 so as to be connected to the illuminance sensor 52 (see FIG. 3). In addition, one end of the fluorescent glass 54 with respect to the longitudinal direction and the illuminance sensor 52 are connected by optical fibers 57. The illuminance sensor 52 is connected to the moving mechanism 58 disposed in the case body 41. The illuminance sensor 52, the arm 56 and the light guide unit 51 can be moved in the right and left direction by the moving mechanism 58. The light guide unit 51 can be located at a standby position outside the irradiation area 30, and any positions in the irradiation area 30 with respect to the right and left direction. The light guide unit 51 can be moved in the substrate moving path of the wafer W. FIG. 4 shows the light guide unit 51 located at the standby position.

In order to measure the illuminance of the irradiation area 30, the upper surface of the fluorescent glass 54 extend in a horizontal plane such that the upper surface is positioned at the same level (height) as the irradiation area 30, i.e., the surface of the wafer W. The ultraviolet light incident on the fluorescent glass 54 is converted to visible light, and is guided to the illuminance sensor 52 through the optical fibers 57. Namely, the fluorescent glass 54 is a wavelength conversion member that converts the spectrum distribution of the light. By guiding visible light to the illuminance sensor 52, the following effects can be obtained. That is, as compared with a case where ultraviolet light is guided to the illuminance sensor 52, the energy received by the illuminance sensor 52 is reduced, so that the temperature rise of the illuminance sensor 52 is avoided, and thus degradation of detection precision of the illuminance sensor 52, which might be caused by the temperature rising, can be avoided, that is to say, temperature drift can be avoided.

Figure 8:
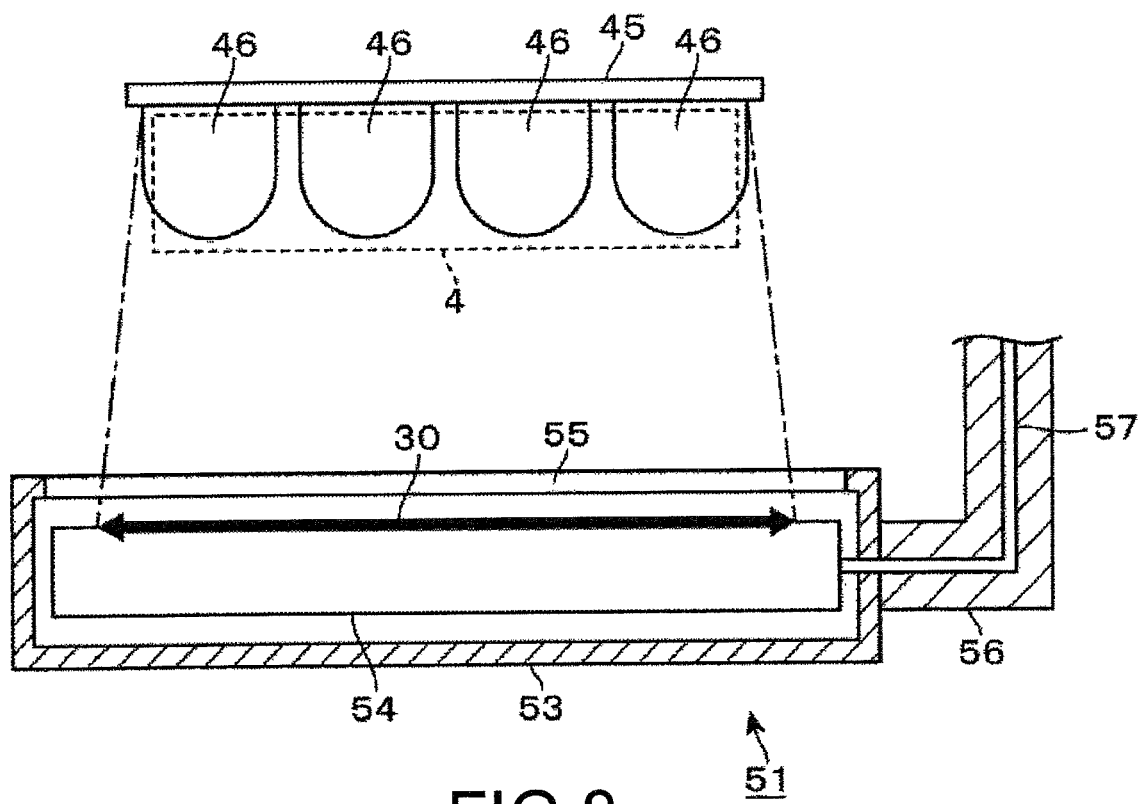
FIG. 8 is a vertically-sectioned side view of the light guide unit.
Figure 9:
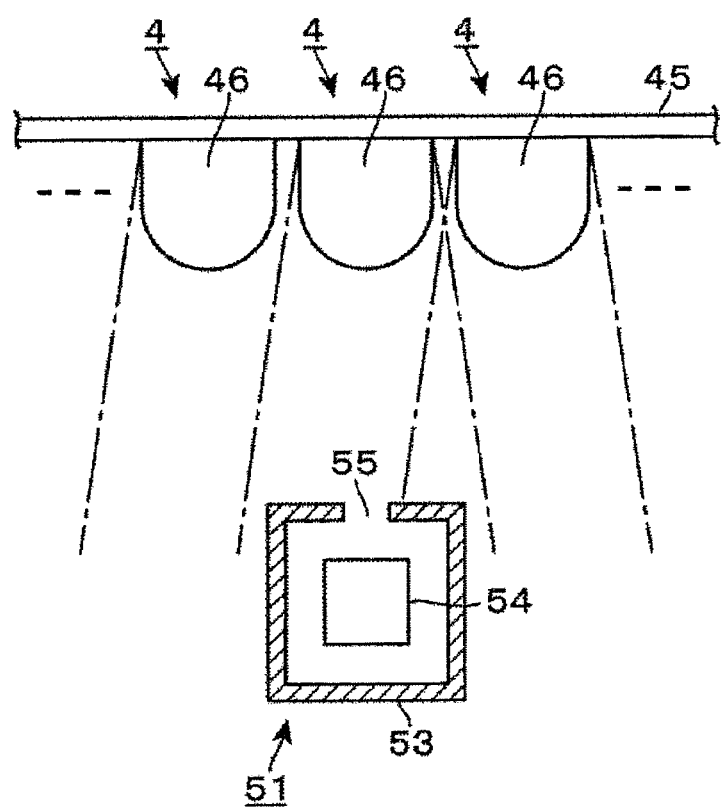
FIG. 9 is a vertically-sectioned front view of the light guide unit.

In FIGS. 8 and 9, chain dot lines show a light path formed by each cell 4. In order to ensure that the light falling on the whole length, extending from the front end to the rear end (in the direction of the short dimension), of the irradiation area 30 can be received by the fluorescent glass 54, the front end of fluorescent glass 54 is positioned forward of the front end of the irradiation area 30 and the rear end of fluorescent glass 54 is positioned rearward of the rear end of the irradiation area 30. The slit 55 of the light guide unit 51 allows only a part of light emitted from the cell 4 to reach the fluorescent glass 54, so that the light quantity to be supplied to the illuminance sensor 52 is reduced, whereby degradation of detection precision of the illuminance sensor 52 due to temperature rising (i.e., temperature drift) is prevented. In addition, since the dimension (size) of the slit 55 in the right and left direction is small (smaller than that in the front and rear direction), illuminance values in a larger number of different positions in the longitudinal direction of the irradiation area 30 can be detected. That is, the light guide unit 51 is capable of obtaining the illuminance distribution in the longitudinal direction of the irradiation area 30 with a high resolution.

Figure 10:
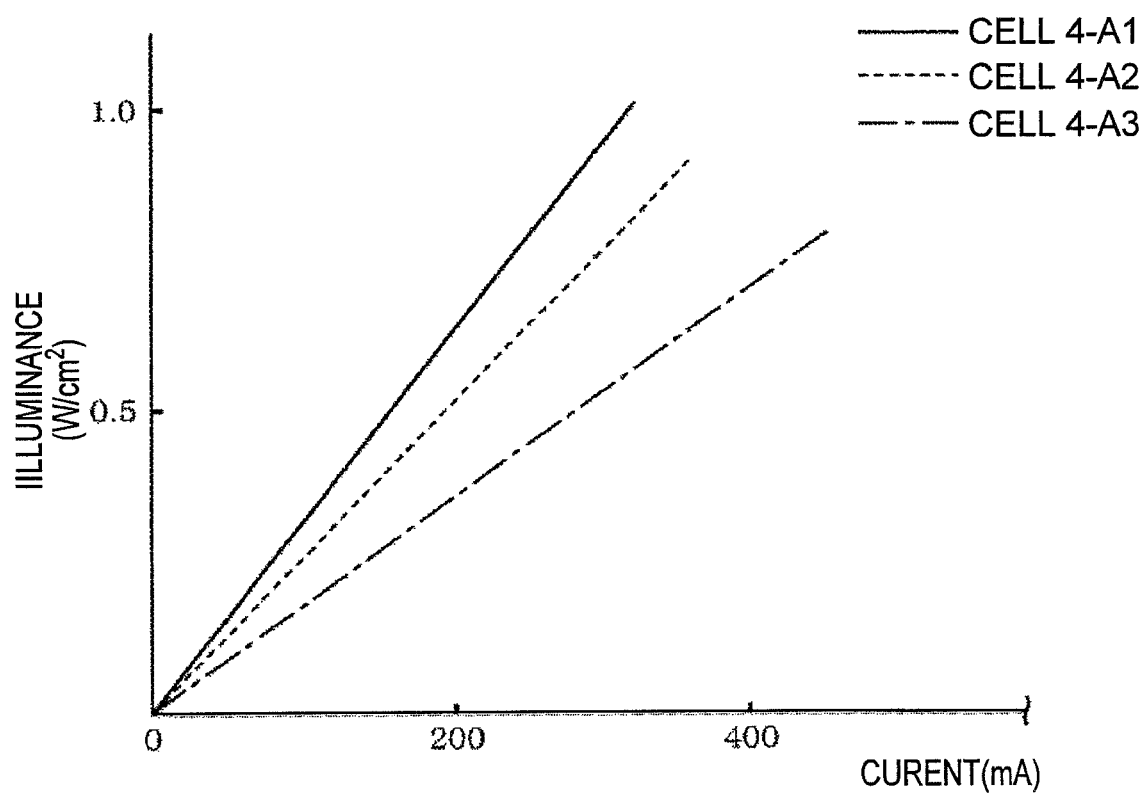
FIG. 10 is a graph schematically showing data stored in a memory provided in the flood exposure module.
Figure 11:
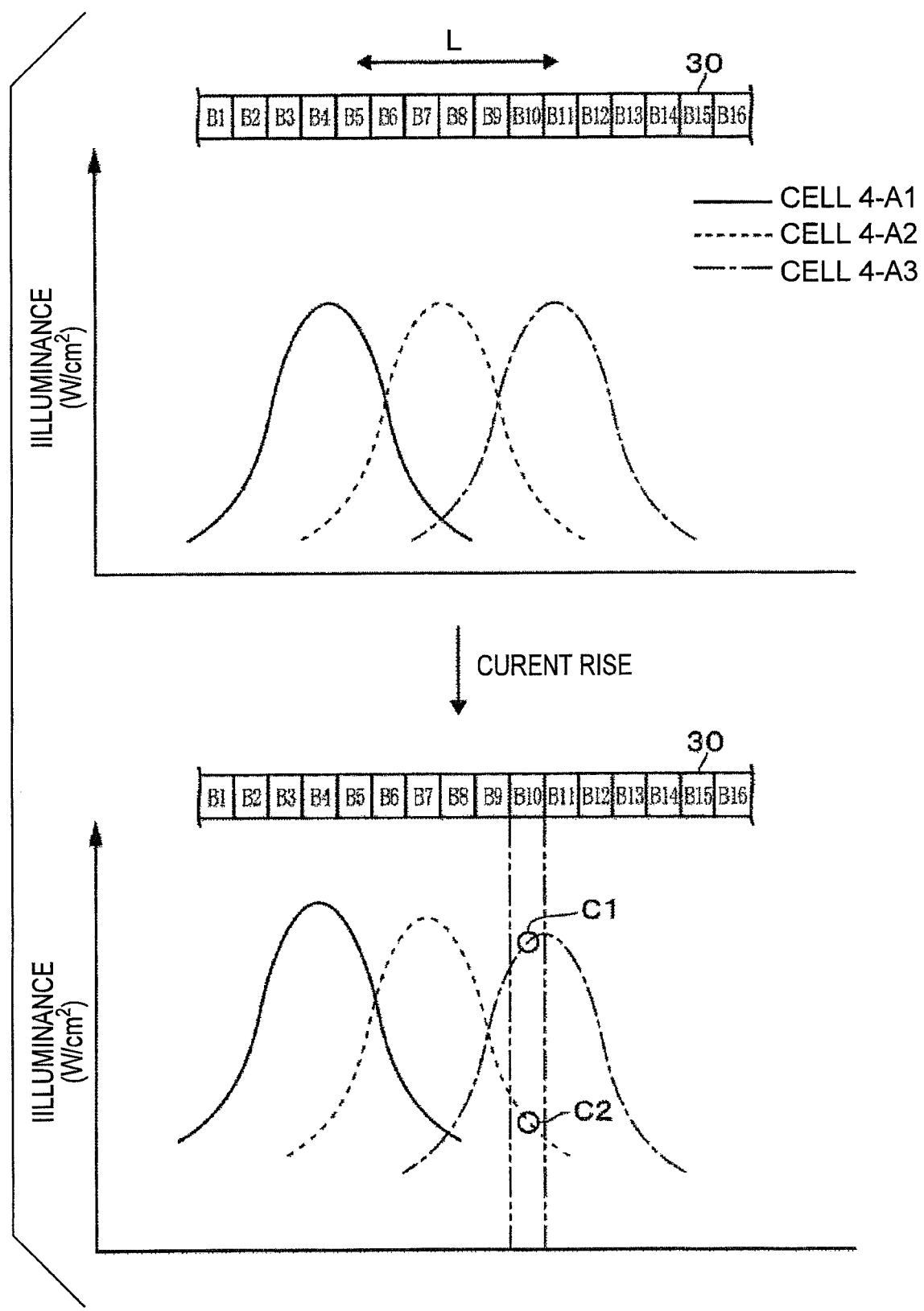
FIG. 11 shows graphs schematically showing the data stored in the memory.

Returning to FIG. 6, the control board 49 is further described. The control board 49 includes an operation unit 59 and a memory 50. Data stored in the memory 50 are described with reference to FIGS. 10 and 11 schematically showing the data. Three cells 4-A1 to 4-A3 shown in FIGS. 10 and 11 are cells selected from 4-1 to 4-89 as representative. In FIG. 10, the axis of abscissa shows the supply current (unit: mA) supplied to the cells 4, and the axis of ordinate shows illuminance (unit: $W/cm^2$). The illuminance herein means an illuminance when only one cell 4 emits light. That is, the memory 50 stores the relationship between the current supplied to one cell 4, and the illuminance of a portion (subarea) of the irradiation area 30 irradiated with light emitted from said one cell 4. Herein, it is assumed that the above relationship can be expressed by a linear function as shown in the graph. The above relationship is referred to as "current-illuminance relationship". Since characteristics of the cells 4 are different from one another, different current-illuminance relationships corresponding to the respective cells 4 are stored in the memory 50.

The irradiation area 30 is divided equally into subareas in the longitudinal direction. The number of the subareas is n ("n" is an integer), and these subareas are numbered from 1 to n. The illuminance in each subarea is detected as described below. In FIG. 11, reference signs B1 to B16 are assigned to some of the subareas consecutive in the left and right direction. In the upper graph of FIG. 11, the axis of ordinate shows the illuminance (unit: $W/cm^2$). Respective positions on the axis of abscissa in the graph correspond to respective positions of the subareas B1 to B16, which are shown above the axis of abscissa. The waveforms in the graph show illuminance distributions formed by the light emitted from the respective cells 4-A1 to 4-A4 when a predetermined current is supplied to each of the cells 4-A1 to 4-A4. In more detail, each waveform shows the illuminance of each subarea when only one cell 4, in other words, the contribution of the light emitted from the one cell 4 to the illuminance of the subareas. The data on the waveform is referred to as "individual cell illuminance distribution". The individual cell illuminance distribution for each cell 4 is stored in the memory 50.

Herein, it is assumed that (the shape of) the waveform, or individual cell illuminance distribution, is not changed, but the waveform is just shifted upward (the illuminance values of the subareas are similarly increased), when the current supplied to each cell 4 is increased from a certain current (corresponding to the upper graph) to a larger current (corresponding to the lower graph). In other words, the distribution of the contribution of the light emitted from each cell 4 to the illuminance of the subareas is kept constant. As described with reference to FIG. 10, the increase amount of the illuminance is different among the cells 4. The illuminance of each subarea corresponds to the sum of the illuminance values of the respective cells 4 that emit light to that subarea. To be specific, in the lower graph of FIG. 11 showing that the subarea B10 is irradiated with light from the cells 4-A1 and 4-A2, the illuminance by the cell 4-A1 is (C1) $W/cm^2$, the illuminance by the cell A4-2 is (C2) $W/cm^2$, and thus the illuminance of the subarea B6 is (C1+C2) $W/cm^2$.

Other data stored in the memory 50 are described. The memory 50 stores, for each cell 4, a value of a current to be supplied to a cell 4 (set supply current value). The calculation unit 59 provided on the control board 49 controls the current adjusting unit 48 such that each cell 4 is supplied with the set supply current, and updates the set supply current value based on the illuminance distribution of the irradiation area 30 which is obtained as described below. The memory 50 also stores data on the allowable value of the illuminance, and data on the reference value of the illuminance of each subarea. When the detected illuminance of each subarea falls below the allowance value, the set supply current value is updated such that the illuminance is returned to the reference value.

The flood exposure module 3 is provided with the control unit 10 formed of a computer as shown in FIG. 3. The control unit 10 stores a program, not shown. The program includes a group of steps that are configured to transmit control signals to the units/devices constituting the flood exposure module 3 so as to perform exposure of the wafer W and illuminance adjustment, which are described below. Specifically, upon execution of the program, the operations including rotation of the stage 33 by the rotation mechanism 34, back and forth movement of the stage 33 by the rotation mechanism 34, emission of light from the light emitting unit 38 and stop of the emission, detection of a notch N by monitoring a light quantity received by the light receiver 39, opening and closing of the shutter 44, operation control of the control board 49 and so on are performed. The program may be stored in a storage medium such as a compact disc, a hard disc, an MO (photo optical disc) or a memory card, and may be installed in the control unit 10.

Figure 12:
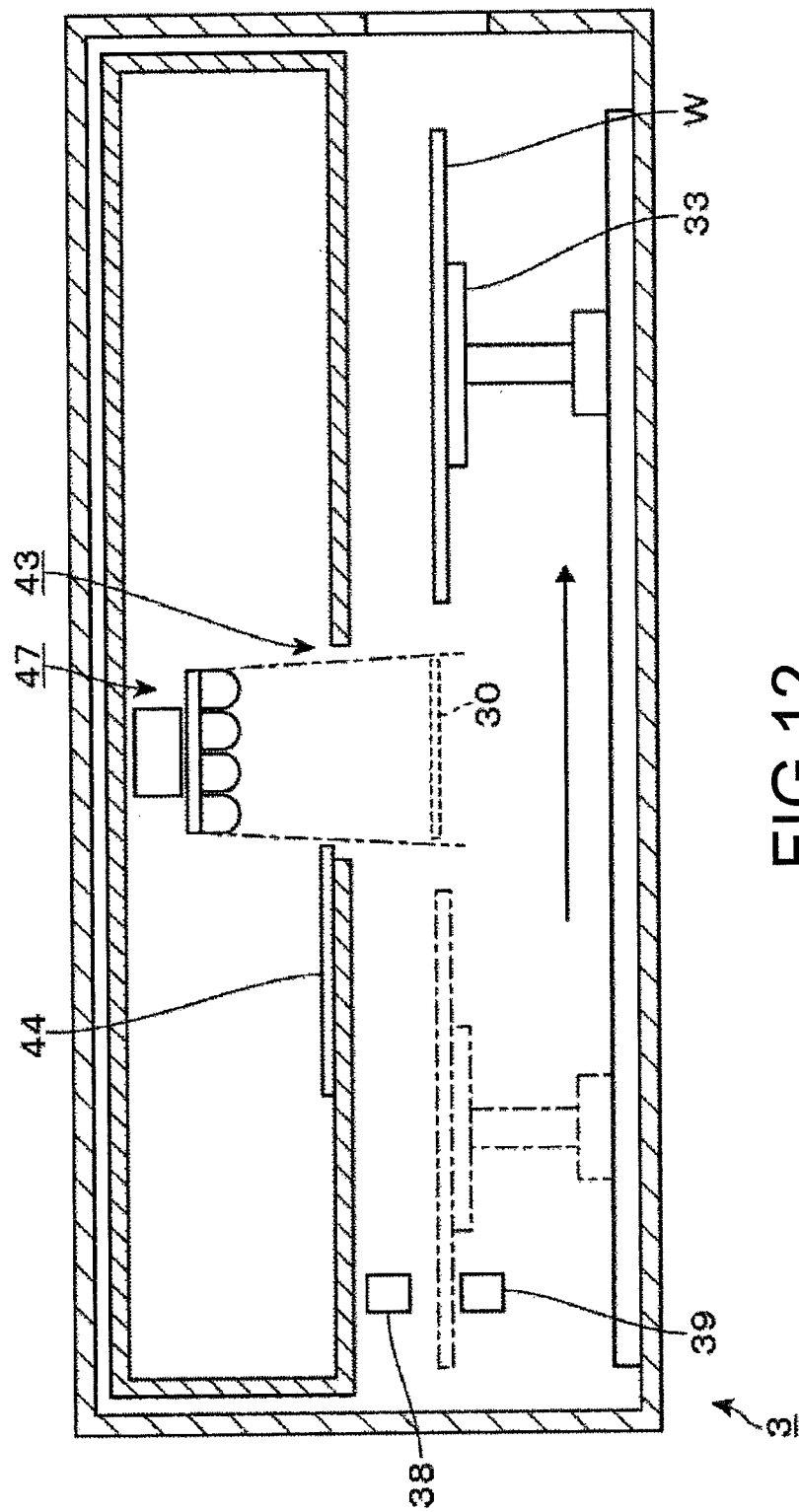
FIG. 12 is an explanatory diagram showing an exposure process by the flood exposure module.

Next, exposure of the wafer W by the flood exposure module 3 is described. Under conditions where currents of set supply current values stored in the memory 50 are supplied to the respective cells 4, and the exposure opening 43 is closed by the shutter 44, the wafer W is placed by the transport arm F5 on the stage 33 located at the transfer position. Thereafter, the stage 33 is moved to the orientation adjustment position, and light is emitted from the light emitting unit 38 to the light receiver 39. The wafer W is rotated once, and the orientation of the notch N is detected. After the wafer W is rotated such that the notch N is directed in a predetermined direction, the rotation of the wafer W is stopped. Then, the shutter 44 is moved to open the exposure opening 43, and the stage 33 is moved toward the transfer position as shown in FIG. 12. Thereafter, the wafer W passes through the irradiation area 30 formed by light emitted from the respective cells 4 so that the whole surface of the wafer W is exposed. Then, the shutter 44 is moved to close the exposure opening 43. When the stage 33 reaches the transfer position, the stage 33 is stopped. After that, the wafer W is unloaded from the flood exposure module 3 by the transport arm F5.

Figure 13:
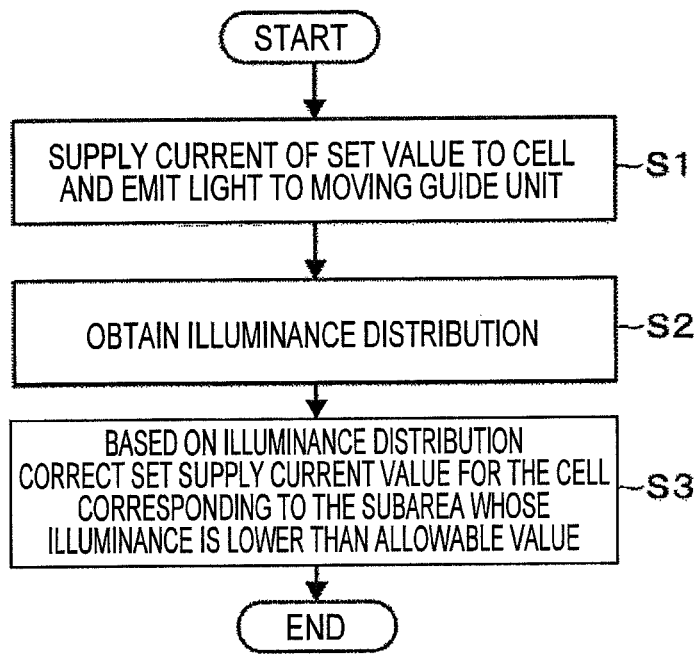
FIG. 13 is a flowchart of an illuminance adjustment process by which currents supplied to the cells are adjusted.
Figure 14:
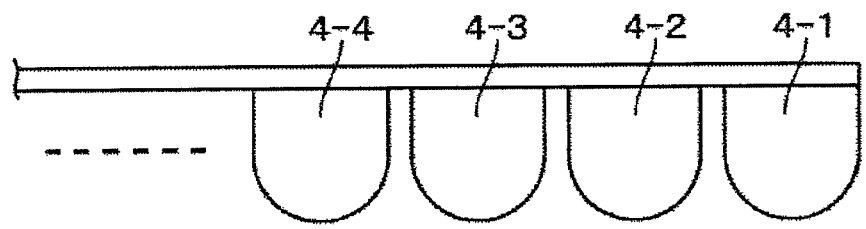
FIG. 14 is an explanatory diagram showing an operation of the light guide unit when the supply current is adjusted.
Figure 14:
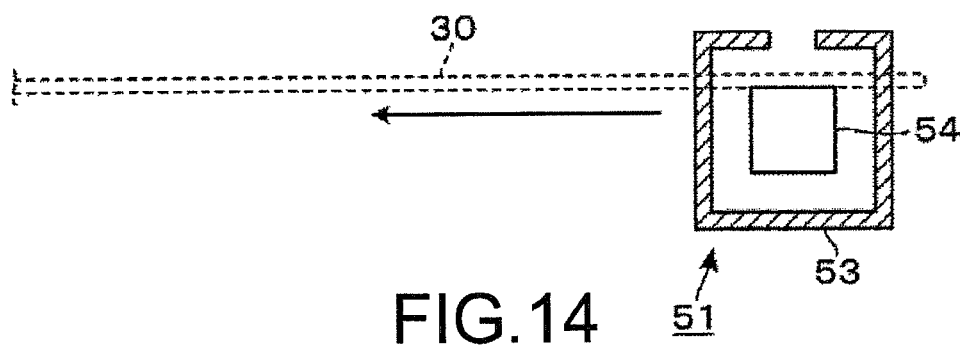
Figure 15:
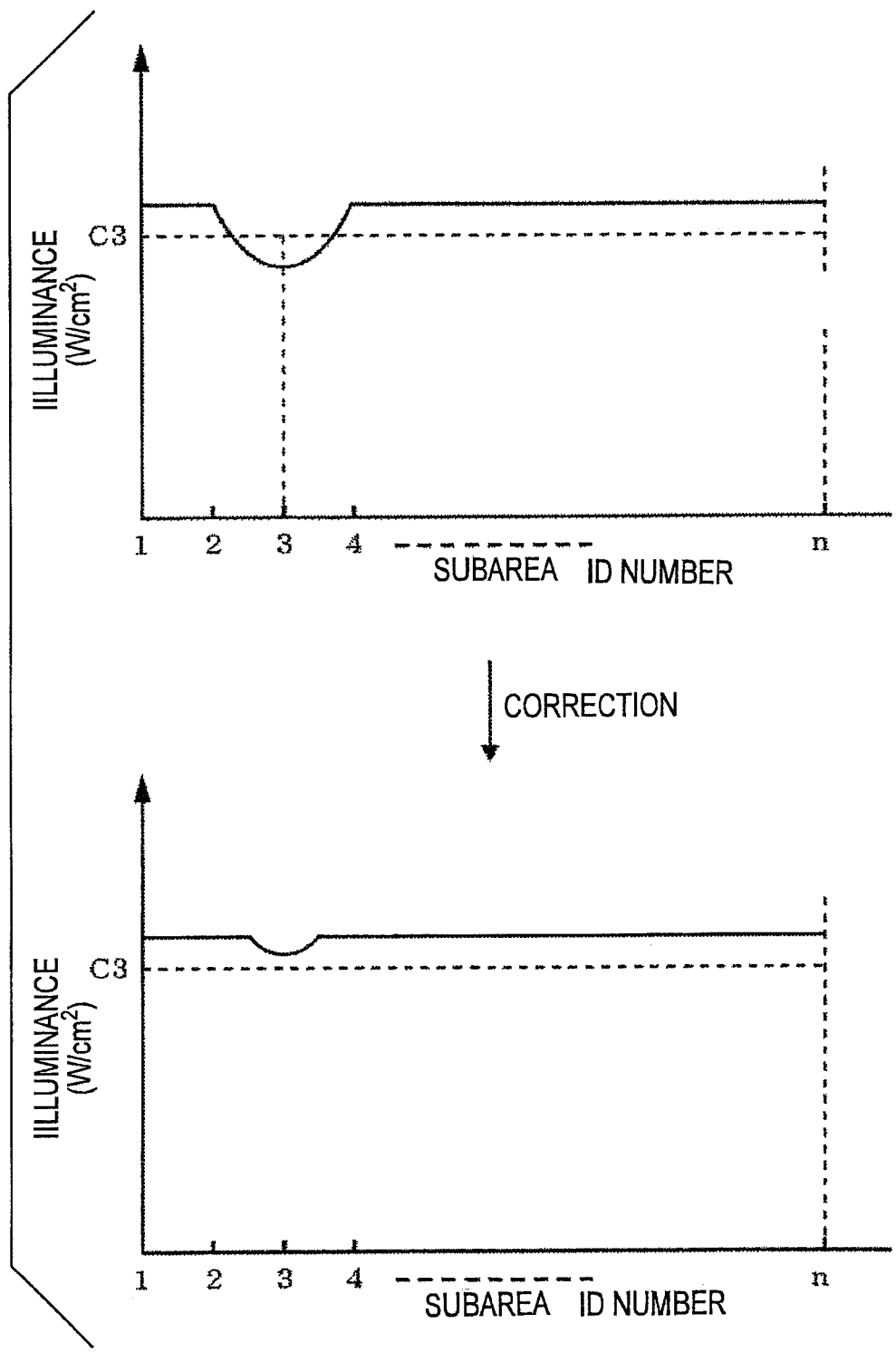
FIG. 15 shows graphs each showing an example of obtained illuminance distribution.

Next, the operation for illuminance adjustment is described with reference to a flowchart of FIG. 13. Under conditions where the wafer W is not loaded into the housing 31, and set supply currents stored in the memory 50 are supplied to the respective cells 4, the shutter 44 is moved to open the exposure opening 43. Then, as shown in FIG. 14, the light guide unit 51 located at the standby position is moved to one end (e.g., the left end) of the irradiation area 30, and is moved toward the other end (e.g., the right end) in the right and left direction. The light guide unit 51 is moved at a constant speed. During this movement, the fluorescent glass 54 of the light guide unit 51 is irradiated with ultraviolet light (step S1). Then, visible light converted from the ultraviolet light is guided to the illuminance sensor 52, and the illuminance sensor 52 outputs a current corresponding to the illuminance of each subarea. The current value (detection current value) is stored in the memory 50. The light guide unit 50 is continuously moved, so that detection currents of the respective subareas (areas defined by dividing the irradiation area 30 in the longitudinal direction of the irradiation area 30) are obtained. When the light guide unit 51 reaches the other end of the irradiation area 30, the shutter 44 is moved to close the exposure opening 43 and the light guide unit 51 returns to the standby position. The illuminance distribution in the longitudinal direction of the irradiation area 30 is obtained from the obtained detection currents (step S2). The upper graph of FIG. 15 shows the thus obtained illuminance distribution, in one example. The axis of ordinate of the graph shows the illuminance (unit: W/cm$^2$), and the axis of abscissa shows the position (identification number) of the subareas. C3 in the graph shows the illuminance allowable value.

Following thereto, it is judged whether or not the detected illuminance of each subarea falls below the allowable value. If the illuminance of a certain subarea is judged to fall below the allowable value, the set supply current value of the cell 4 corresponding to that subarea is updated (step S3) based on the current-illuminance relationship and the individual cell illuminance distribution, which have been described with reference to FIGS. 10 and 11. Thus, the illuminance adjustment is completed.

One specific example of the aforementioned update of the set supply current value is described below. The difference between the detected illuminance and the illuminance reference value set for that subarea is calculated for the subarea having the largest difference between the illuminance allowance value and the detected illuminance (Step 1). For example, in a case where the illuminance distribution shown in the upper graph of FIG. 15 is obtained, the subarea 3 has the largest difference between the allowable value and the detected illuminance. Then, the difference between the detected illuminance of the subarea 3 and the illuminance reference value set for thesubarea 3 is calculated. After the calculation of the difference, the cell 4 which most contributes the illuminance of that subarea is identified based on the individual cell illuminance distribution. Then, the value of the set supply current to be supplied to that cell 4 is increased so as to eliminate the difference, by using the current-illuminance relationship (step2).

If the set supply current value is increased according to the above, the illuminance of subareas other than the subarea (e.g., subarea 3) having the aforementioned largest difference also increases. The increase amount of the illuminance in such a subarea can be obtained by a calculation based on the individual cell illuminance distribution and the current-illuminance relationship. The illuminance distribution that is corrected by increasing the set supply current can be obtained. If there is no subarea, whose illuminance is judged to fall below the allowable value, in the corrected illuminance distribution, the illuminance adjustment is completed. If there is a subarea whose illuminance is judged to fall below the allowable value, the steps 1 and 2 are performed repeatedly. The lower graph of FIG. 15 shows the illuminance distribution corrected from the illuminance distribution shown in the upper graph of FIG. 15, by correcting the set supply current value of the cell corresponding to the subarea 3, as described above. In the corrected illuminance distribution, illuminance values of the respective subareas exceed the allowable value C3. Thus, the correction of the set supply current is not carried out any more, and the illuminance adjustment is completed.

The correction procedure of the supply set current value to each of the cells 4-1 to 4-89 comprising the steps S1 to S3 in the flowchart is referred to as "calibration". The calibration may be performed regularly or irregularly. For example, in the flood exposure module 3, the calibration may be performed after all the wafers W belonging to one production lot have been processed and before wafers W belonging to a succeeding production lot are transported to the flood exposure module 3. The calibration may be performed every time when the flood exposure to one wafer W is completed. The calibration may be performed every time when the flood exposure module 3 is powered and activated.

The above description explained that the memory 50 stores the illuminance allowable value and the illuminance reference value, and that the calibration is performed based on the illuminance allowable and reference values and a detected illuminance. Since the detected illuminance corresponds to the detection current outputted from the illuminance sensor 52, it can be said that the memory 50 stores an allowable value of the detection current and a reference value of the detection, current, and that the calibration is performed based on the detection current and the allowable and reference values of the detection current. Thus, the memory 50 may store any of the data about illuminance values and the data about currents. In FIG. 15, the illuminance allowable value of all the subareas is constantly C3 all over the subareas (i.e., the whole irradiation area 30). However, the flood exposure module 3 is not always operated such that the illuminance values of all the subareas (i.e., the whole irradiation area 30) are identical to each other. That is, different illuminance allowable values may be assigned to the respective subareas.

In the flood exposure module 3, the light guide unit 51 is moved in the longitudinal direction of the irradiation area 30 to receive light, and the illuminance of each subarea and thus the the illuminance distribution in the longitudinal direction of the irradiation area 30 are obtained based on the light received by the light guide unit 51. The light quantity emitted from each cell 4 is corrected based on the illuminance distribution, so that the illuminance of each subarea is prevented from falling below the allowable value. Thus, since the exposure amount of each portion in the plane of the wafer W can be prevented from falling below a set value, the variation of the CD of the resist pattern formed after the flood exposure by the flood exposure module 3 among the portions in the plane of the wafer W can be suppressed.

In the above embodiment, the wafer W is not being rotated while the wafer W is being exposed by moving it from the orientation adjustment position to the transfer position. However, the exposure can be carried out while rotating the wafer W during the movement. In addition, in the above embodiment, the adjustment of the illuminance distribution in the longitudinal direction of the irradiation area 30 is performed automatically, but the adjustment may be manually performed by a user of the flood exposure module 3. An example of the manual adjustment is described. Firstly, when a predetermined operation is performed by a user to the control unit 10 that is a computer, the light guide unit 51 of the illuminance distribution detection unit 5 is moved along the longitudinal direction of the irradiation area 30 as described above, so that an illuminance distribution, which is shown in FIG. 15 by way of example, is obtained. The control unit 10 is configured such that the the thus obtained illuminance distribution is displayed on a monitor included in the control unit 10. Then, the user watching the illuminance distribution display selects a cell 4 of which set supply current value is to be corrected. By a predetermined operation through the control unit 10, the set supply current value of the selected cell 4 is corrected by a predetermined correction amount. After the correction, the light guide unit 51 is again moved to obtain an illuminance distribution which is then displayed on the monitor. Thus, the user can confirm whether the correction was performed appropriately.

An example of a method for obtaining the individual cell illuminance distribution described with reference to FIG. 11 is described. For example, while all the cells 4 are turned on, the illuminance distribution in the longitudinal direction of the irradiation area 30 is obtained. Then, one of the 89 cells 4 is turned off, and the illuminance distribution is similarly obtained. By calculating the difference between the two illuminance distributions, the individual cell illuminance distribution of the turned-off cell 4 can be obtained. There is another method of obtaining the individual cell illuminance distribution in which only one of the 89 cells is turned on, and an illuminance distribution of an area below the cell 4 is obtained, which may be an equivalent to the individual cell illuminance distribution of the cell 4. Note that, as described above, the light quantity of the LED 46 varies depending on the temperature of the LED 46. Thus, in the latter method in which only one cell 4 is turned on, it takes relatively a long time before the cell 4 has a predetermined temperature and the aforementioned illuminance distribution can be properly obtained. Thus, the former method of calculating the difference is preferred in that the individual cell illuminance distributions of all the cells 4 can be in a short time.

( Second Embodiment )

Figure 16:
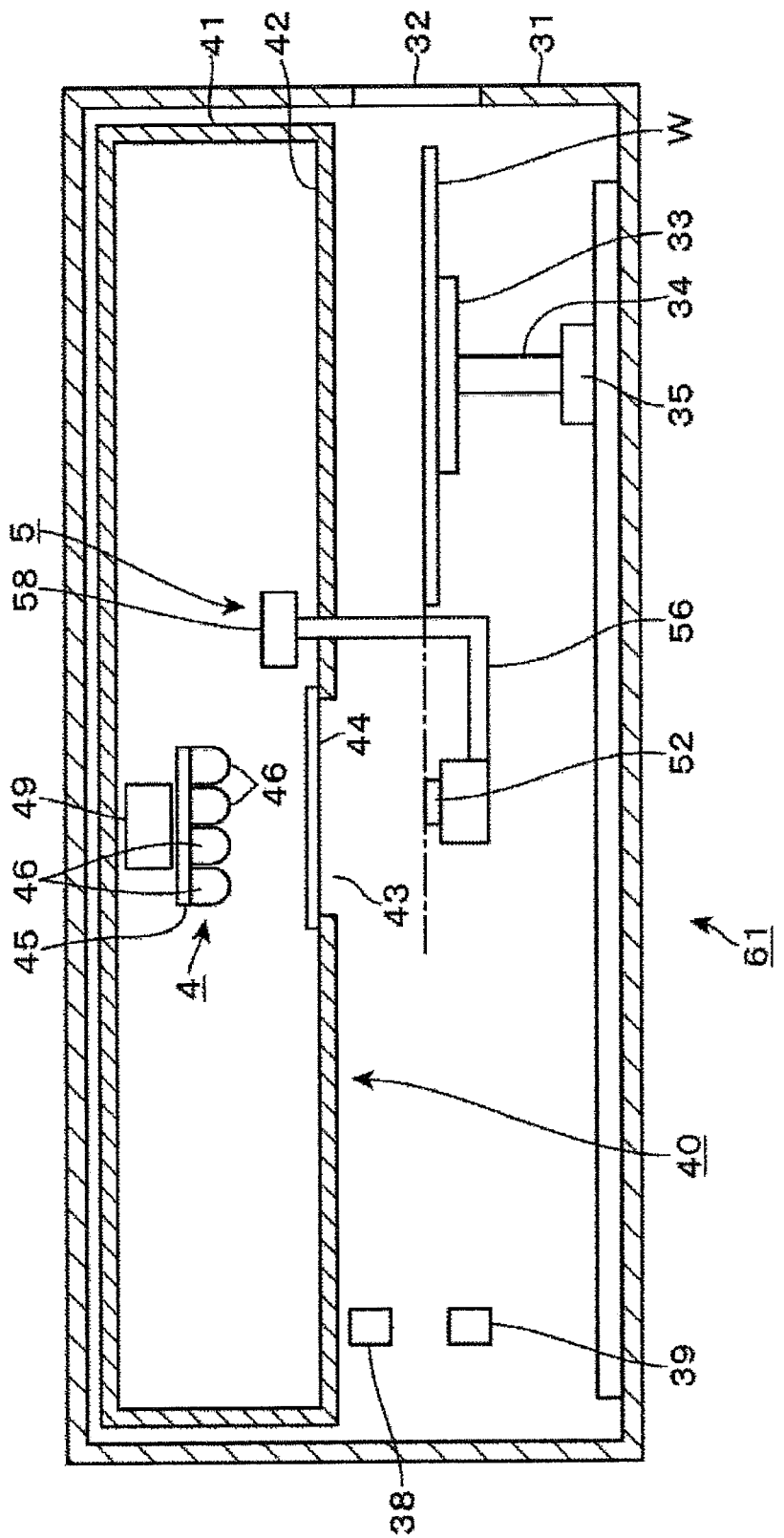
FIG. 16 is a vertically-sectioned side view of a flood exposure module in a second embodiment.
Figure 17:
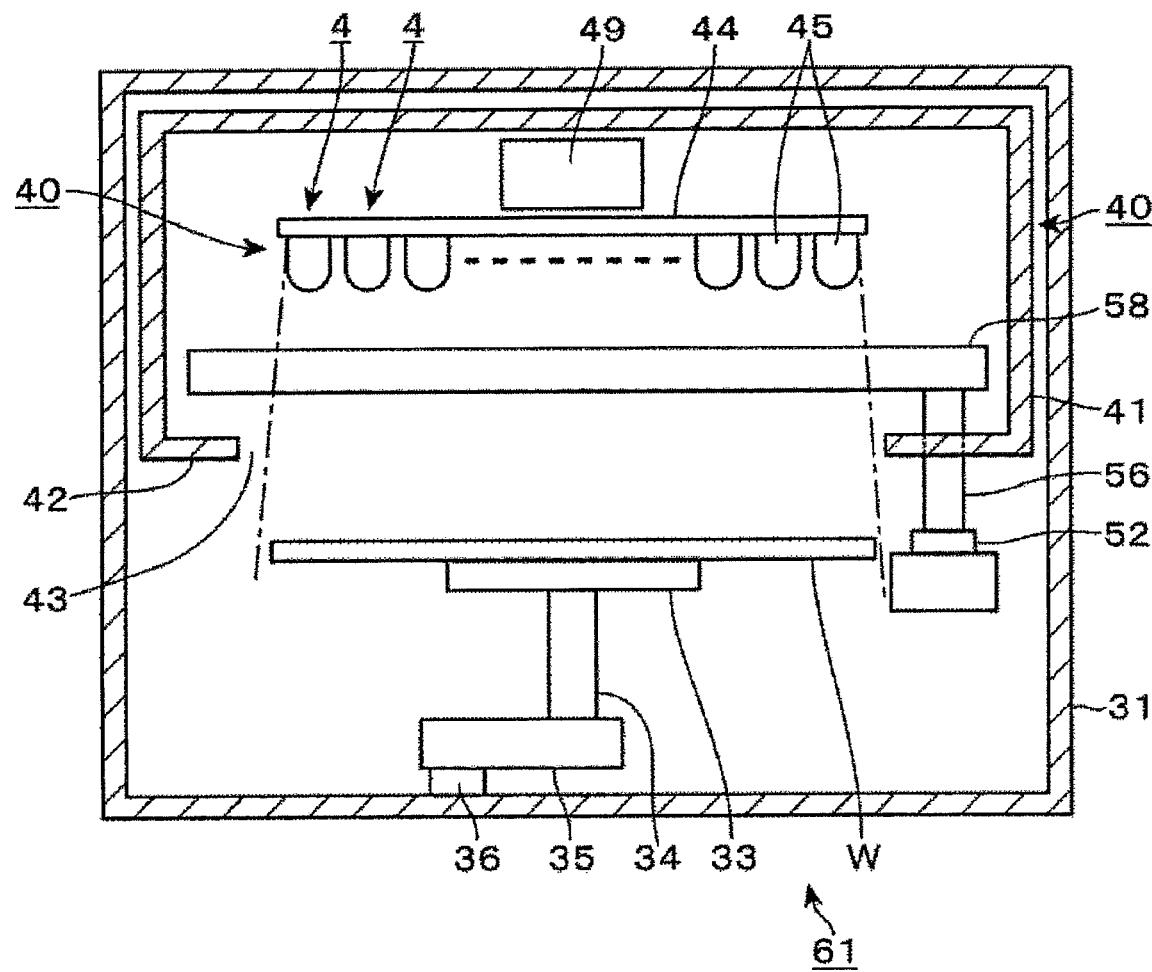
FIG. 17 is a vertically-sectioned rear view of the flood exposure module.

A flood exposure module 61 in a second embodiment is described with reference to FIG. 16 which is a vertically-sectioned side view and FIG. 17 which is a vertically-sectioned rear view. The description is made focusing mainly on the differences from the flood exposure module 3 in the first embodiment. In the flood exposure module 61, the detection unit 5 does not have the light guide unit 51. Below the case body 41, an illuminance sensor 52 instead of the light guide unit 51 is supported on one end of the arm 56. The other end of the arm 56 extends into the case body 41 of a light source unit 40, and is connected to a moving mechanism 58. The illuminance sensor 52 can be moved by the moving mechanism 58 in the right and left direction, similarly to the light guide unit 51 in the first embodiment. When the illuminance adjustment is performed, the illuminance sensor 52 can be located at each subarea of the irradiation area 30. On the other hand, when the wafer W is exposed, the illuminance sensor 52 stands by at the standby position outside the irradiation area 30. In the flood exposure module 61, since the illuminance sensor 52 is located in the irradiation area 30, ultraviolet light is emitted to the irradiation sensor 52 without being converted into visible light. FIG. 17 shows the illuminance sensor 52 located at the standby position.

The illuminance sensor 52 in the second embodiment receives, by its horizontal upper surface, ultraviolet light emitted from the respective cells 4, and send detection currents corresponding to illuminance values through a wiring, not shown, for example, to the control board 49. In order to detect the illuminance on the surface of the wafer W, the upper surface of the illuminance sensor 52 is located at the same height as the surface of the wafer W placed on a stage 33. The dotted chain lines in FIG. 16 show the height of the surface of the wafer W and the height of the upper surface of the illuminance sensor 52.

In the flood exposure module 61, exposure of the wafer W is performed similarly to that in the flood exposure module 3, and the calibration described in the first embodiment is also performed for the illuminance adjustment. However, in the step S1 of the flowchart described with reference to FIG. 13, detection currents corresponding to the illuminance values of the respective subareas are obtained by moving the illuminance sensor 52, in place of the light guide unit 51, from one end to the other end of the irradiation area 30 in the longitudinal direction thereof. Similarly to the flood exposure module 3, the flood exposure module 61 as structured above can prevent deviation of exposure amounts of each portion of the wafer W from the set value.

(Third Embodiment)

Figure 18:
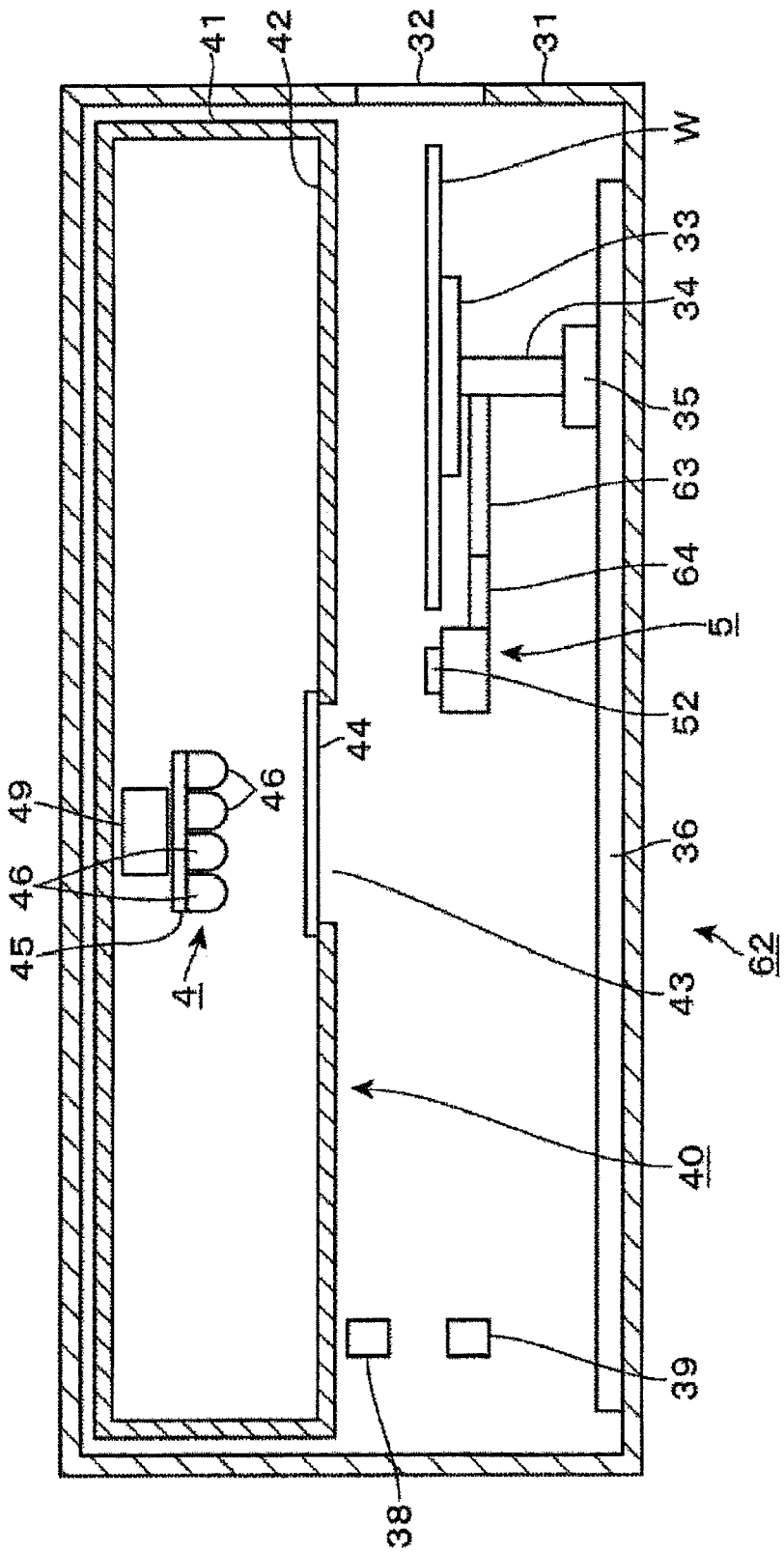
FIG. 18 is a vertically-sectioned side view of a flood exposure module in a third embodiment.
Figure 19:
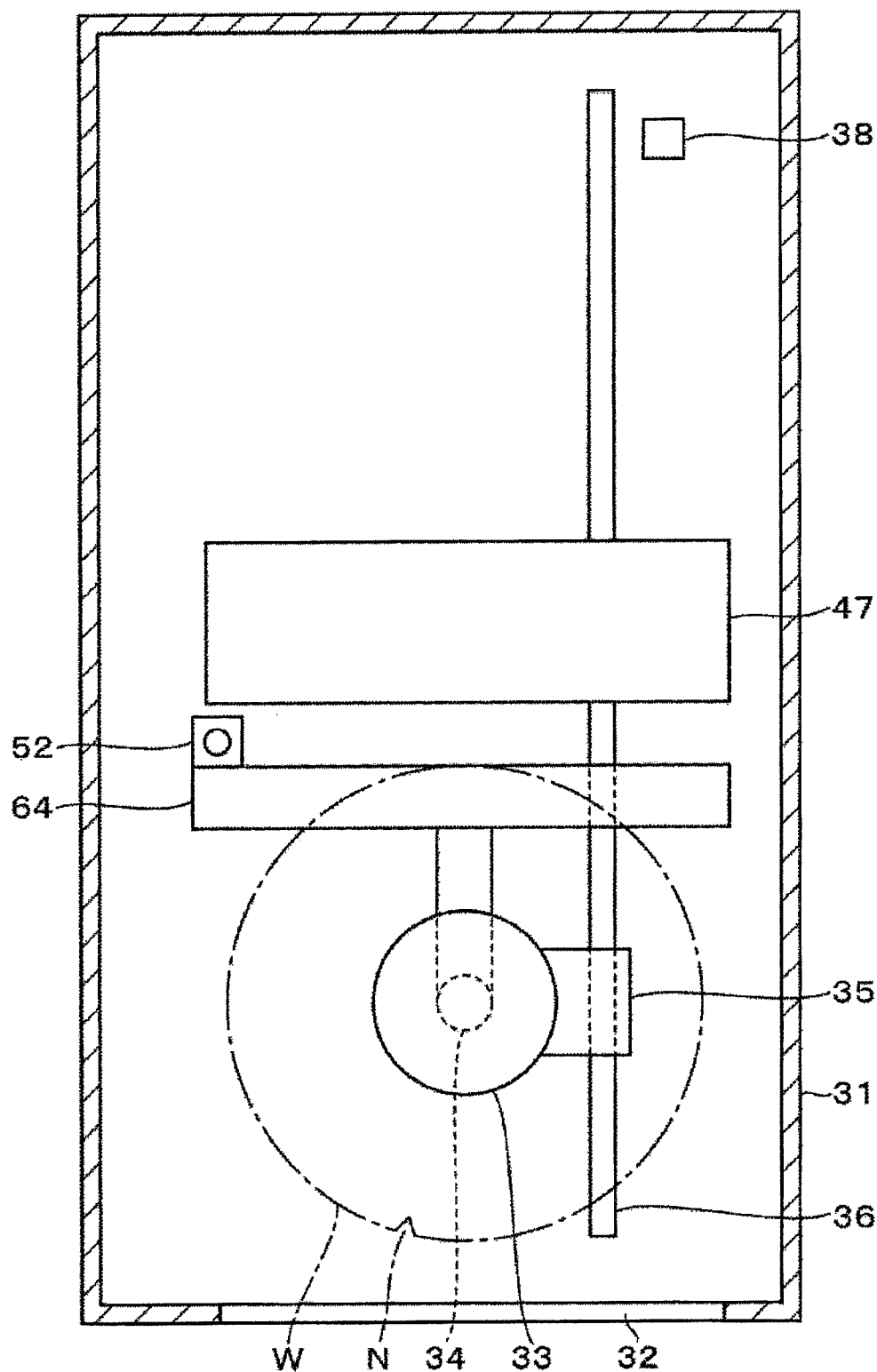
FIG. 19 is a laterally-sectioned plan view of the flood exposure module.

A flood exposure module 62 in a third embodiment is described with reference to FIG. 18 which is a vertically-sectioned side view and FIG. 19 which is a laterally-sectioned plan view. The description is made focusing mainly on the differences from the flood exposure module 61 in the second embodiment. A detection unit 5 in the flood exposure module 62 is composed of an arm 63 extending horizontally and rearward from the rotation mechanism 34, a sensor moving mechanism 64 disposed on the distal end of the arm 63, and the illuminance sensor 52 disposed on the sensor moving mechanism 64. In the flood exposure module 62, the illuminance sensor 52 is moved, together with the stage 33 for placing the wafer W thereon, by the stage moving mechanism 36 in the back and forth direction. In addition, the illuminance sensor 52 is horizontally moved by the sensor moving mechanism 64 in the right and left direction. Similarly to the second embodiment, the upper surface of the illuminance sensor 52 is located at the same height as the surface of the wafer W placed on the stage 33. Similarly to the flood exposure module 61, also in the flood exposure module 62, the calibration is performed by moving the illuminance sensor 52 from one end to the other end of the irradiation area 30 in the longitudinal direction thereof.

(Fourth Embodiment)

Figure 20:
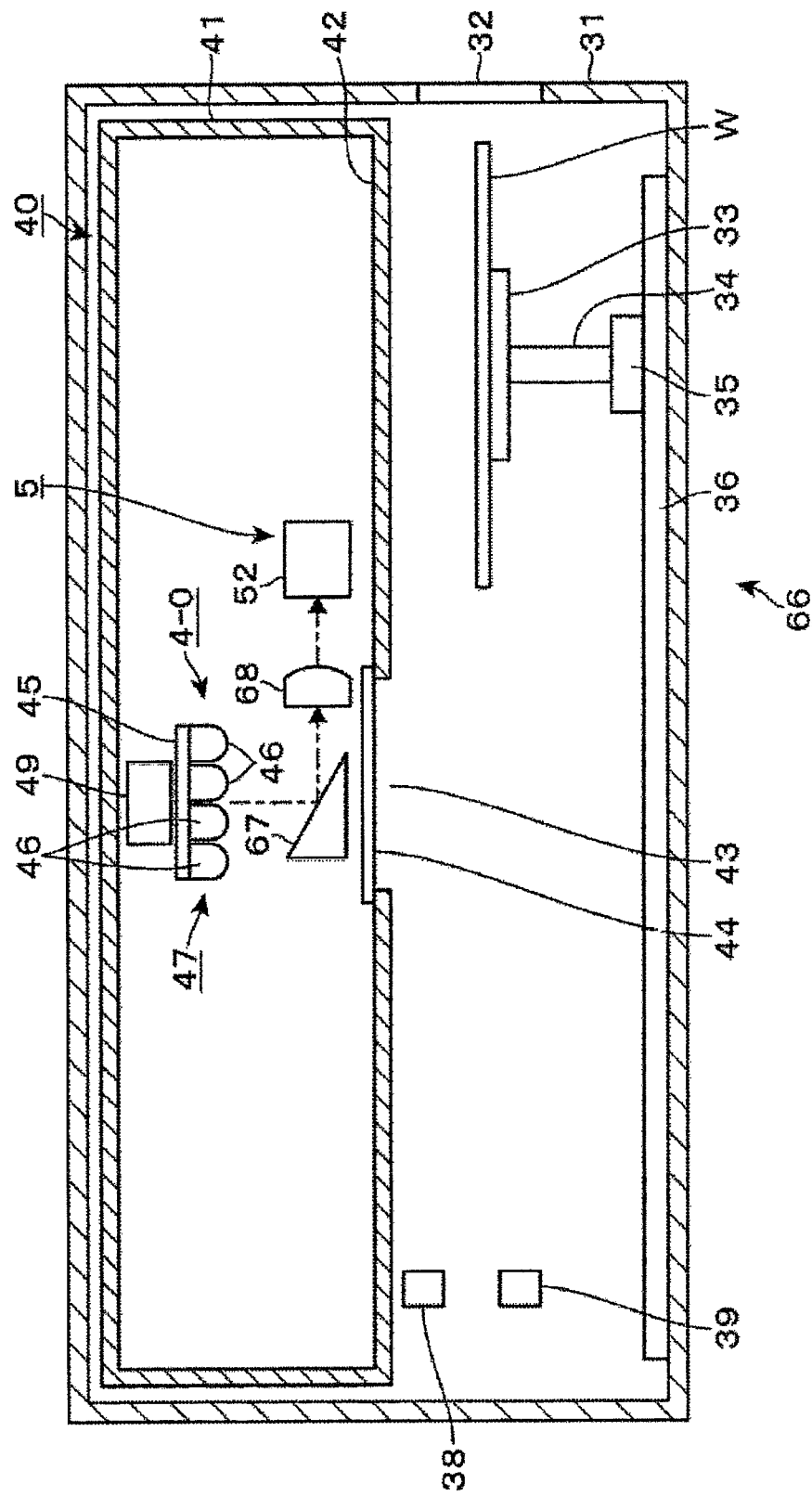
FIG. 20 is a vertically-sectioned side view of a flood exposure module in a fourth embodiment.
Figure 21:
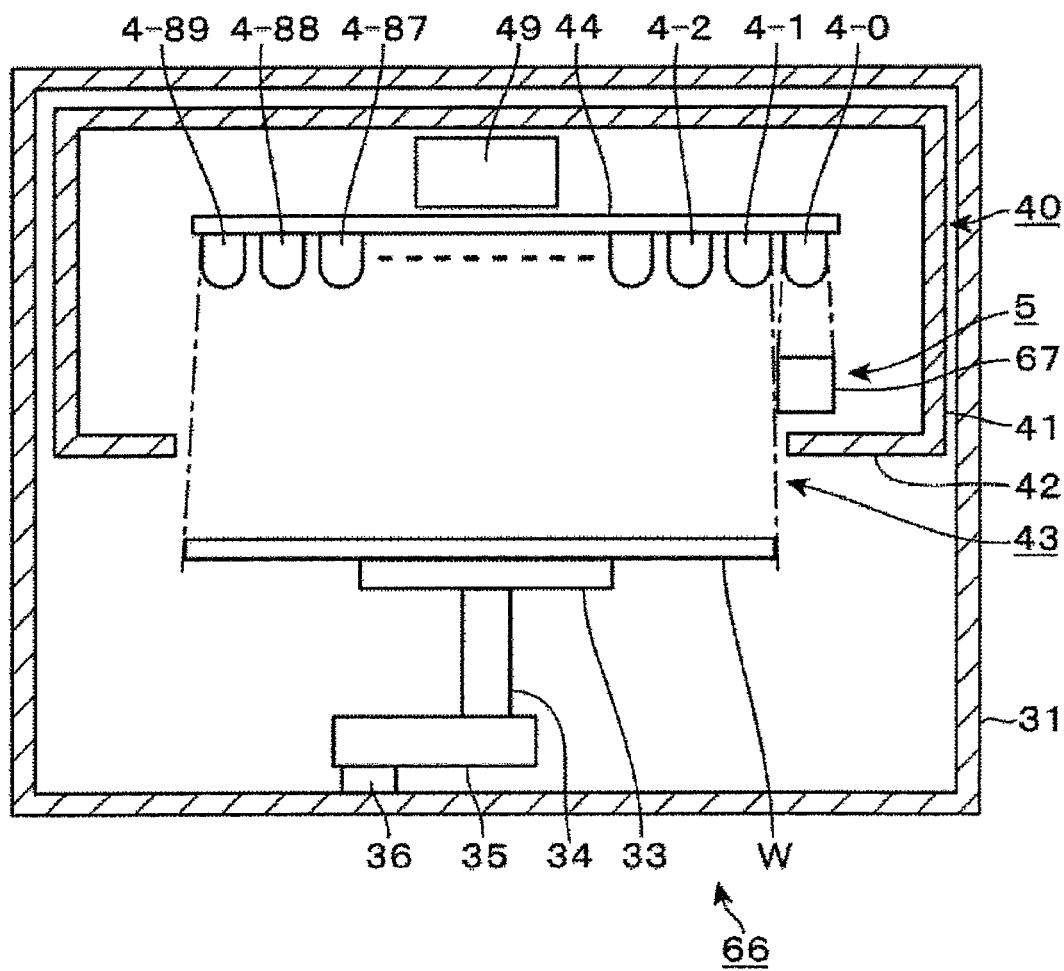
FIG. 21 is a vertically-sectioned rear view of the flood exposure module.

A flood exposure module 66 in a fourth embodiment is described with reference to FIG. 20 which is a vertically-sectioned side view and FIG. 21 which is a vertically-sectioned rear view. The description is made focusing mainly on the differences from the flood exposure module 3 in the first embodiment. In the flood exposure module 66, set supply current values of cells 4-1 to 4-89 are corrected by a method different from the foregoing calibration. In the flood exposure module 66, the number of cells 4 constituting the LED group 47 is greater by one than that in the flood exposure module 3. Namely, LEDs 46 are arranged in a matrix of 4×90 (four rows/ninety columns) on a support board 45. The additional cell 4 is sometimes is also referred to as cell 4-0. Similarly to the cells 4-1 to 4-89, an individual set supply current value is also set for the cell 4-0. Since a current corresponding to the set supply current value is supplied to the cell 4-0, it emits light downward throughout the operation of the flood exposure module 66.

In the LED group 47, the cell 4-0 is disposed on one end in the right and left direction. The cells 4-1 to 4-89 are light irradiation units used for forming an irradiation area 30 to expose the wafer W, as described above, while the cell 4-0 is a monitoring light irradiation unit that does not intend to expose the wafer W. As shown in FIG. 21, the cell 4-0 is located outside the space right above the exposure opening 43 in the right and left direction. Thus, when a shutter 44 is moved to an open position to open the exposure opening 43, the wafer W is not irradiated with ultraviolet light emitted from the cell 4-0. In FIG. 21, dotted chain lines extending from the cell 4-0 show a light path formed by the cell 4-0, and dotted chain lines extending from the cells 4-1 to 4-89 show a light path formed by the cells 4-1 to 4-89. In addition, in FIG. 20, an arrow of dotted chain lines shows a light path formed by the cell 4-0.

A reflection member 67 (e.g., a prism) is disposed below the cell 4-0, so that ultraviolet light emitted from the cell 4-0 is reflected forward. The cells 4-1 to 4-89 do not emit light to the reflection member 67, and only the cell 4-0 emits light to the reflection member 67. A lens 68 is disposed in front of the reflection member 67, and an illuminance sensor 52 is further disposed in front of the lens 68. The lens 68 is preferably made of glass having UV resistance in order to prevent decrease in the amount of light that reaches the illuminance sensor 52 by deterioration. The light reflected by the reflection member 67 is condensed by the lens 68 and is emitted to the illuminance sensor 52. In order to receive the light, the light receiving surface of the illuminance sensor 52 is a vertical surface directed rearward. The flood exposure module 66 is not provided with a sensor moving mechanism 58. Thus, the position of the illuminance sensor 52 is fixed, and the illuminance sensor 52 constantly receives ultraviolet light emitted from the cell 4-0.

The memory 50 of the control board 49 of the flood exposure module 66 stores, in addition to the aforementioned data, a current-illuminance relationship of the cell 4-0, which has been described with reference to FIG. 10, a supply set current value of the cell 4-0, and a reference illuminance of the cell 4-0. Similarly to the other cells 4, a current equivalent to the supply set current value is also supplied to the cell 4-0.

During the operation of the flood exposure module 66, an operation unit 59 of the control board 49 always monitors whether there is a difference between an illuminance detected by the illuminance sensor 52 and the reference illuminance set for the cell 4-0. When the presence of a difference is detected, set supply current values of the respective cells 4-0 to 4-89 are collectively corrected in order to eliminate the difference, by an amount corresponding to the difference value, based on the current-illuminance relationships set for the respective cells. Then, light quantities of the cells 4-0 to 4-89 are corrected.

In the flood exposure module 66, the illuminance of the cell 4-0 is always monitored. When decrease in illuminance is detected, supply currents to the cells 4-0 to 4-89 are corrected by an amount corresponding to the decrease in illuminance, on the assumption that an illuminance of each of the cells 4-1 to 4-89 similarly decreases. Such a correction is referred to as "feedback correction". By conducting this feedback correction, variation of the exposure amounts in respective portions of the wafer W can be prevented. However, the first to third embodiments in which the aforementioned calibration is preformed are preferred, because the illuminance values of the cells 4-1 to 4-89 are directly detected whereby variation of the exposure amounts in respective portions of the wafer W can be more reliably prevented.

(Fifth Embodiment)

Figure 22:
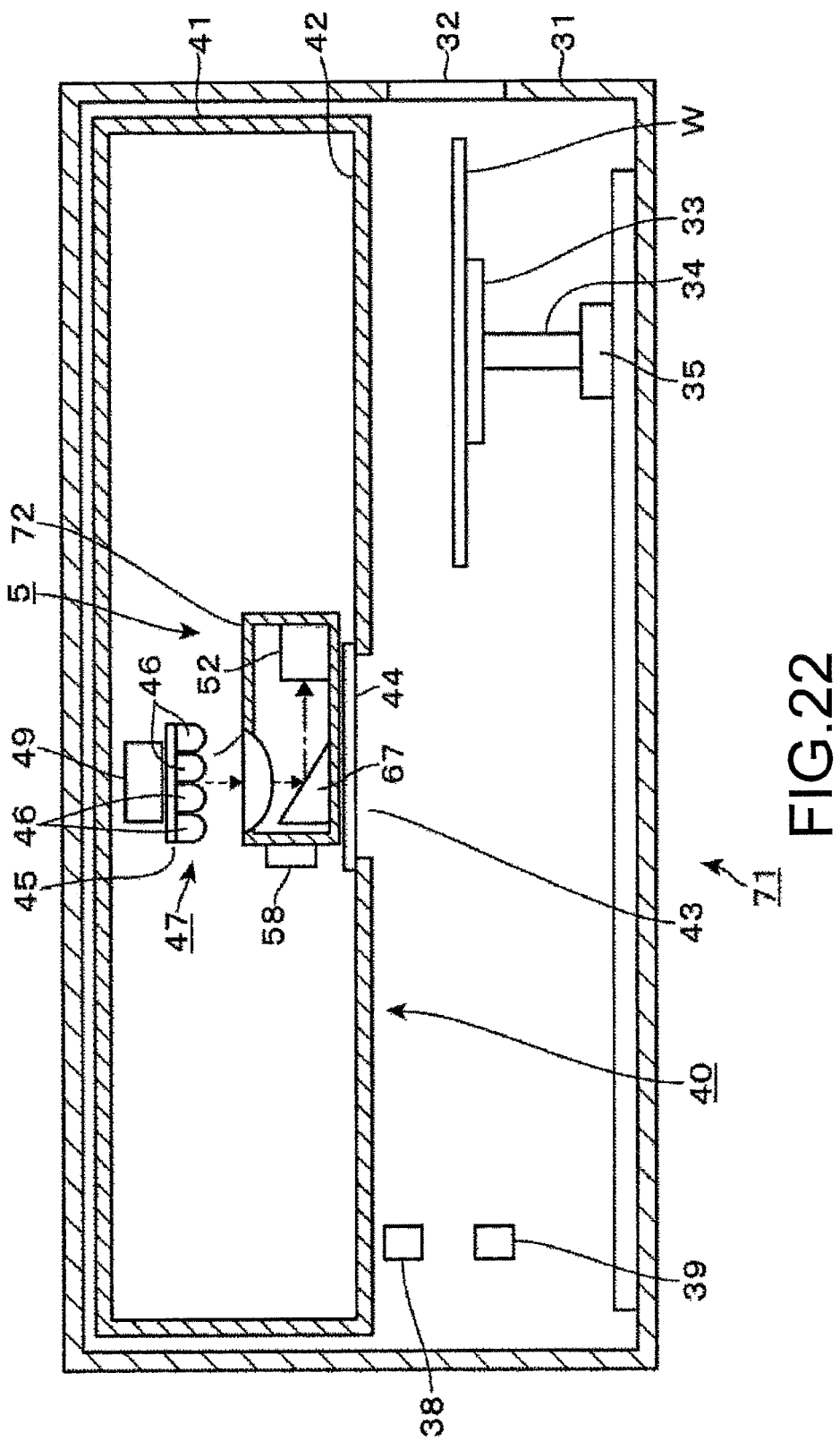
FIG. 22 is a vertically-sectioned side view of a flood exposure module in a fifth embodiment.
Figure 23:
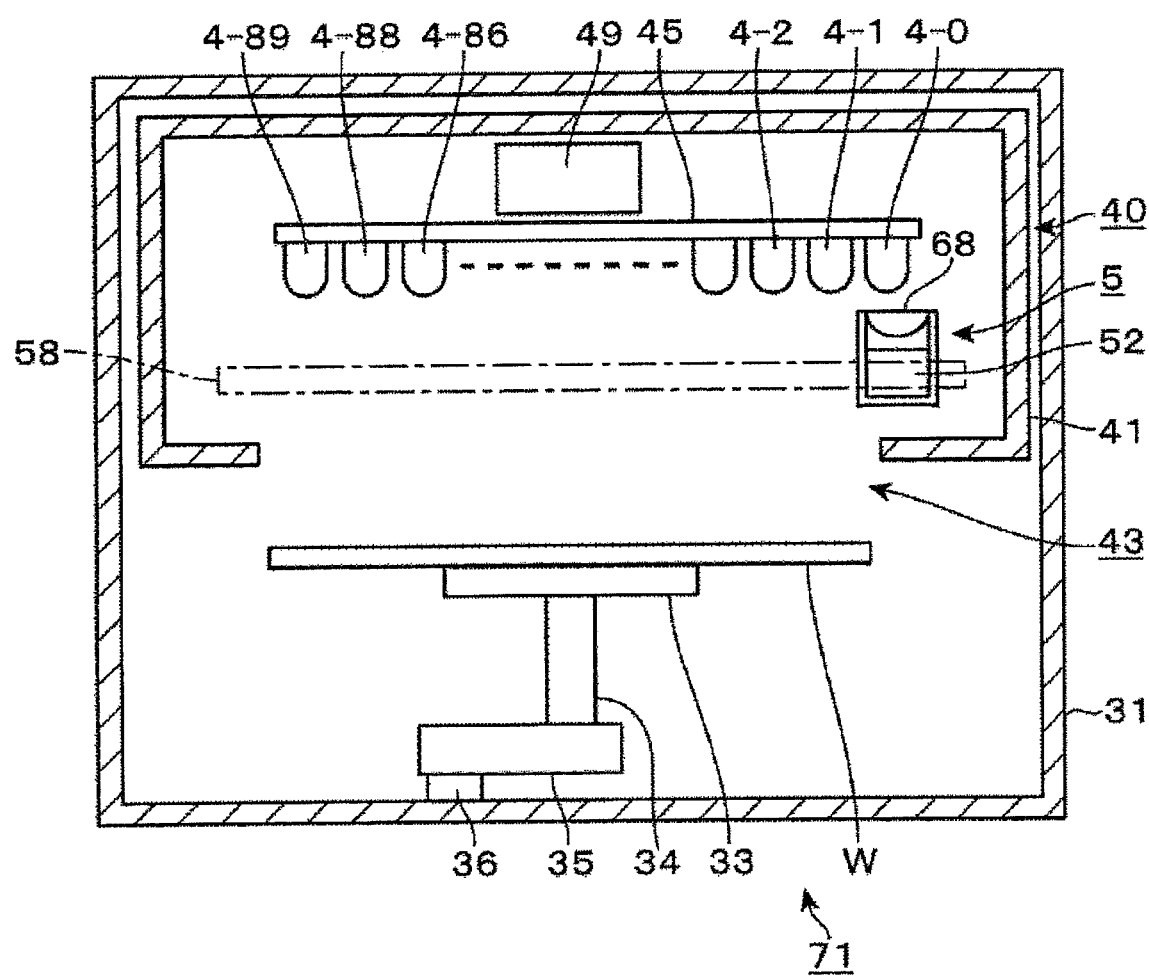
FIG. 23 is a vertically-sectioned rear view of the flood exposure module.

A flood exposure module 71 in a fifth embodiment is described with reference to FIG. 22 which is a vertically-sectioned side view and FIG. 23 which is a vertically-sectioned rear view. The description is made focusing mainly on the differences from the flood exposure module 66 in the fourth embodiment. The flood exposure module 71 is configured to perform both the aforementioned feedback correction and the calibration. The flood exposure module 71 is provided with a support member 72 supporting the reflection member 67, the lens 68 and the illuminance sensor 52. In the flood exposure module 71, the lens 68 is disposed at the same position as the cell 4 with respect to the back and forth direction, such that light emitted from the above cell 4 is condensed as travelling downward. The reflection member 67 reflects the condensed light to the rear illuminance sensor 52.

The support member 72 is connected to the sensor moving mechanism 58 so as to be movable in the right and left direction. Thus, the reflection member 67, the lens 68 and the illuminance sensor 58 can be moved horizontally, with their relative positions being unchanged. Thus, ultraviolet light of the cells 4-1 to 4-89 can be led to the illuminance sensor 52. For example, the illuminance sensor 52 is arranged such that the illuminance of the light receiving surface of the illuminance sensor 52 at any position with respect to the right and left direction is the same as the illuminance of the portion of the irradiation area 30 having the same position as that of the illuminance sensor 52 with respect to the right and left direction. Thus, by moving the illuminance sensor 52 in the right and left direction, the aforementioned calibration can be performed.

At the timing when the calibration is not performed, the reflection member 67, the lens 68 and the illuminance sensor 52 are stopped at a position where the illuminance sensor 52 is irradiated with ultraviolet light emitted from the cell 4-0, and the feedback correction previously described for the flood exposure module 66 is performed. In to the flood exposure module 71 in the fifth embodiment, since the feedback correction is performed between a calibration and the next calibration, decreasing of the light quantities emitted from the cells 4-1 to 4-89 can be prevented. Thus, decrease in the exposure amount in each portion in the wafer W can be more reliably prevented.

( Sixth Embodiment )

A flood exposure module 73 in a sixth embodiment is described with reference to FIGS. 24 and 25 which are vertically-sectioned side views and FIG. 26 which is a vertically-sectioned rear view. The description is made focusing mainly on the differences from the flood exposure module 3 in the first embodiment. Similarly to the flood exposure module 3, the flood exposure module 73 does not perform the feedback correction but performs the calibration. The flood exposure module 73 is provided with, as the detection unit, the illuminance sensor 52 and the sensor moving mechanism 58. The illuminance sensor 52 is arranged such that its light receiving surface is directed rearward. The illuminance sensor 52 is horizontally moved in the right and left direction by the sensor moving mechanism 58.

A lens 74 in a form of a semi-cylindrical lens elongated in the right and left direction is disposed in an ultraviolet irradiation direction of the respective cells 4. The lens 74 is configured to condense light in an arrangement direction of LEDs 46 constituting one cell 4. A support board 45 supporting the LED group 47 and the lens 74 are connected to a rotation mechanism 75. The rotation mechanism 75 rotates the support board 45 and the LEDs 46 about a horizontal axis extending in the right and left direction. Relative positions of the support board 45 and the LEDs 46 are unchanged even when they are rotated. Thus, the orientation of ultraviolet light emitted by the LEDs 46 through the lens 74 can be changed about the horizontal axis. Thus, the rotation mechanism 75 is a moving mechanism that moves the cell 4 in order to change the light irradiation direction.

Figure 24:
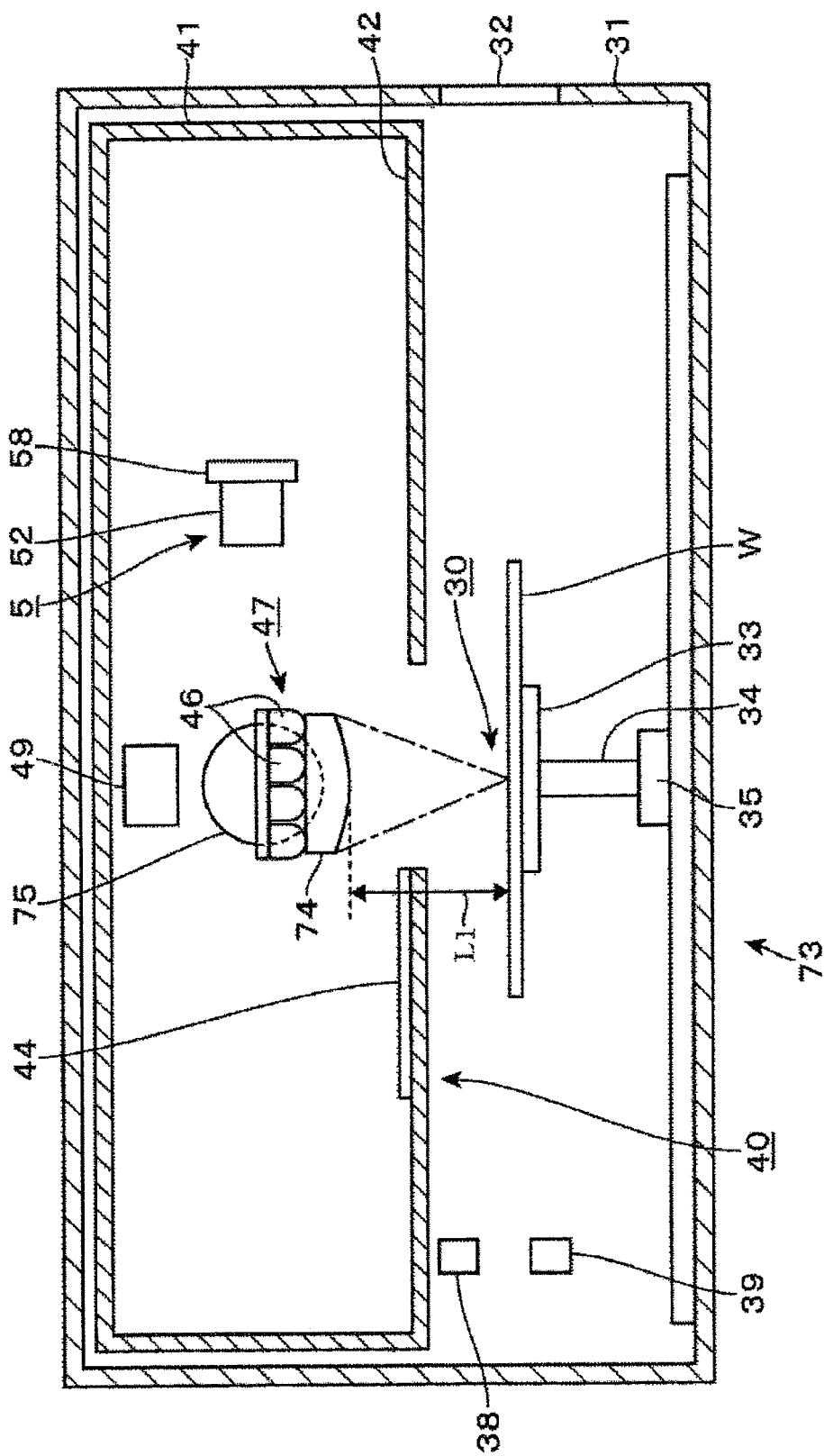
FIG. 24 is a vertically-sectioned side view of flood exposure module in a sixth embodiment.
Figure 25:
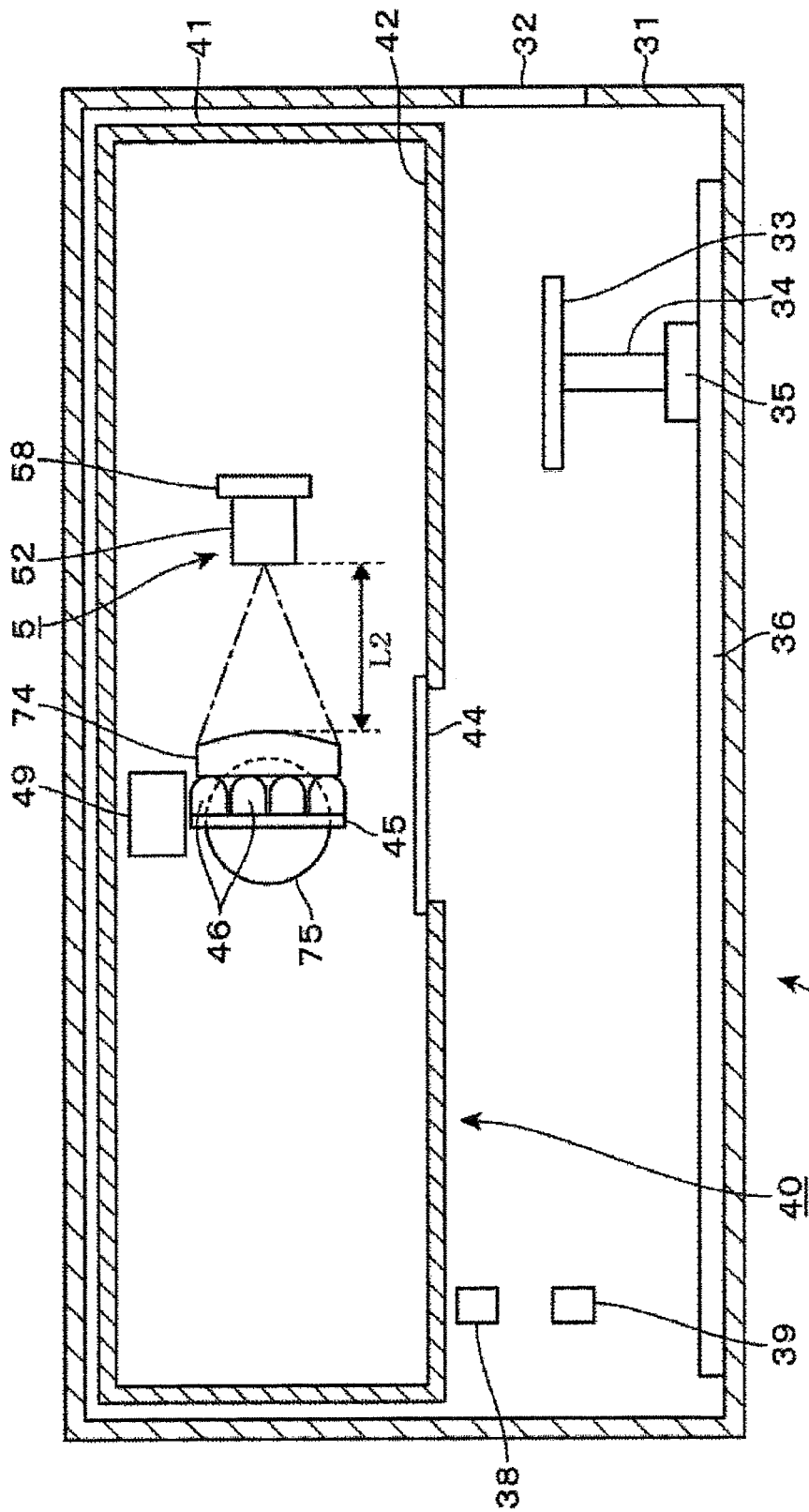
FIG. 25 is a vertically-sectioned side view of the flood exposure module.
Figure 26:
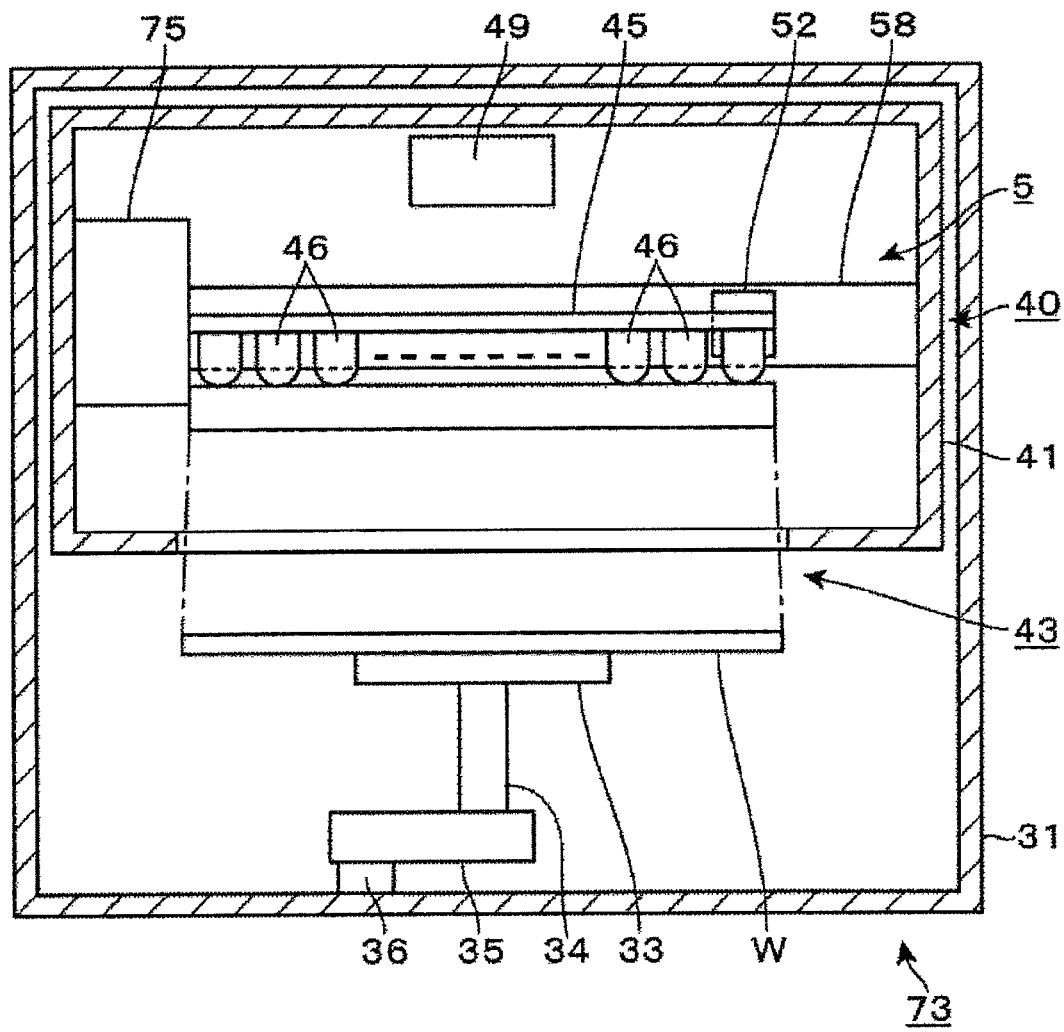
FIG. 26 is a vertically-sectioned rear view of the flood exposure module.

In FIGS. 24 to 26, dotted chain lines show a light path of ultraviolet light emitted from the LED group 47. When the wafer W is exposed, as shown in FIGS. 24 and 26, the LED group 47 emits light downward, and forms the irradiation area 30 to expose the wafer W. Since the light is condensed by the lens 74, the width of the irradiation area 30 in the back and forth direction is smaller than that in the first embodiment. When the calibration is performed, the orientation of the LED group 47 and the lens 74 is rotated by 90 degrees, so that the LED group 47 emits light forward as shown in FIG. 25. When light is emitted forward, the illuminance sensor 52 is moved in the right and left direction.

In order that the illuminance of the light receiving surface of the illuminance sensor 52 is the same as the illuminance of the portion of the irradiation area 30 located at the same position with respect to the right and left direction as the illuminance sensor 52, the vertical distance L1 from the apex of the lens 74 to the surface of the wafer W, which is shown in FIG. 24, and the horizontal distance L2 from the top of the lens 74 to the light receiving surface of the illuminance sensor 52, which is shown in FIG. 25, are identical to each other. Also in the flood exposure module 73 as structured above, an abnormal exposure amount in each portion of the wafer W can be prevented by performing the calibration.

( Seventh Embodiment )

Figure 27:
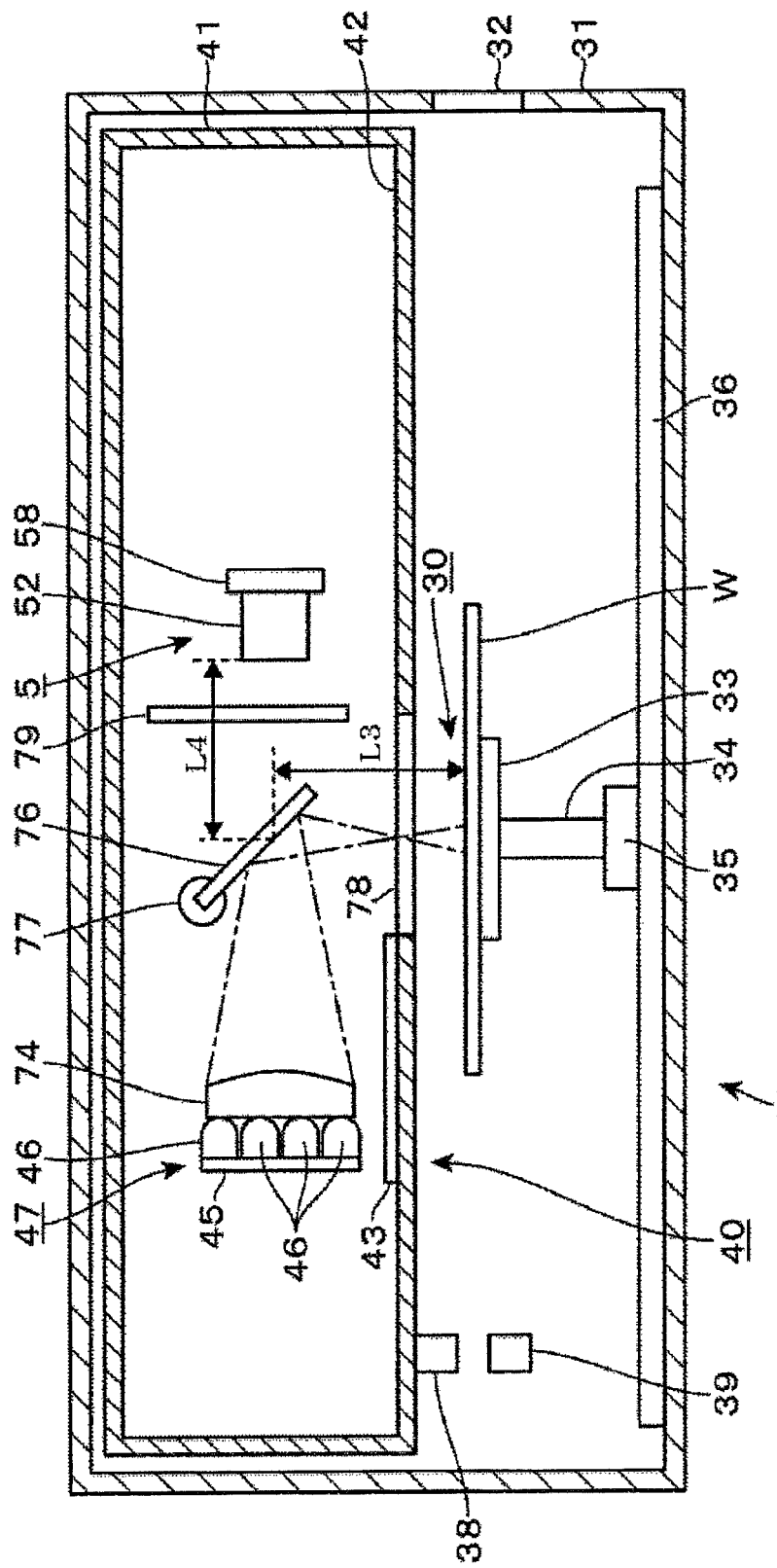
FIG. 27 is a vertically-sectioned side view of a flood exposure module in a seventh embodiment.
Figure 28:
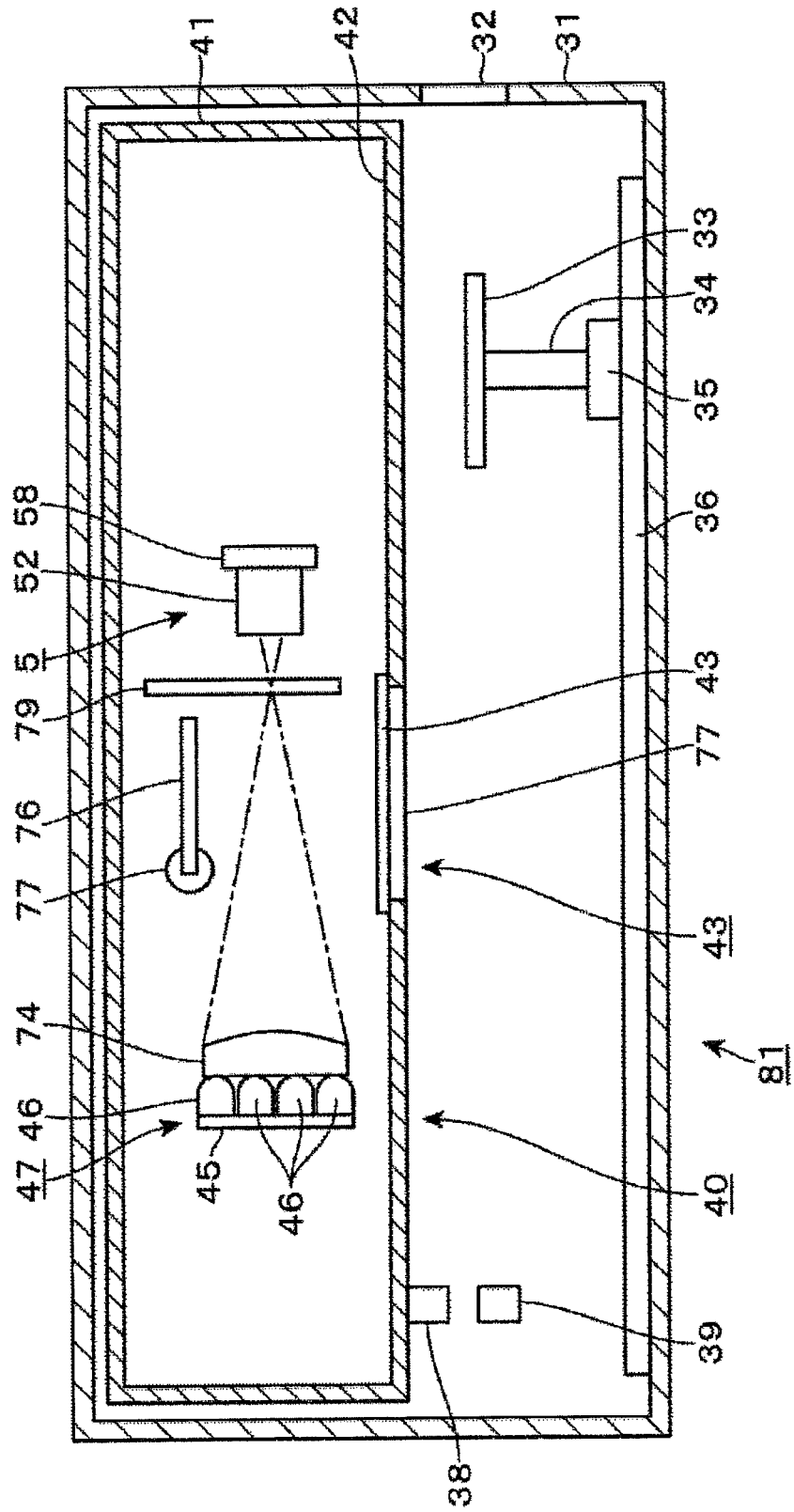
FIG. 28 is a vertically-sectioned side view of the flood exposure module.

A flood exposure module 81 in a seventh embodiment is described with reference to FIGS. 27 and 28 which are vertically-sectioned side views. The description is made focusing mainly on the differences from the flood exposure module 71 in the sixth embodiment. In the flood exposure module 81, the LED group 47 is disposed rearward from the exposure opening 43 in the case body 41, and the LED group 47 emits ultraviolet light forward. The aforementioned lens 74 is disposed in front of the LED group 47. A mirror 76 which is a reflection member for totally reflecting light is disposed in front of the lens 74. The mirror 76 is connected to a rotation mechanism 77 for changing the position of the mirror 76. The mirror 76 can be rotated by the rotation mechanism 77 about a horizontal axis extending in the right and left direction. Thus, the mirror 76 can be moved between a reflection position on a light path of the light emitted from the lens 74, and a non-reflection position outside the light path. FIG. 27 shows that the mirror 76 is located at the reflection position, while FIG. 28 shows that the mirror 76 is located at the non-reflection position. In FIGS. 27 and 28, dotted chain lines show a light path formed of light emitted from the LED group 47.

The mirror 76 located at the reflection position reflects ultraviolet light emitted from the LED group 47 such that the ultraviolet light travels downward to the exposure opening 43. The exposure opening 43 is provided with a diffuser panel 78. The ultraviolet light, having been reflected by the mirror 76, is diffused in the back and forth direction by the diffuser panel 78 and then falls on the wafer W so as to form an irradiation area 30 in the wafer W. A diffuser panel 79 is disposed in front of the mirror 76. When the mirror 76 is located at the non-reflection position, the diffuser panel 79 diffuses ultraviolet light emitted from the LED group 47 in the up and down direction. The illuminance sensor 52 is disposed in front of the diffuser panel 79. Similarly to the illuminance sensor 52 of the flood exposure module 73 in the sixth embodiment, the illuminance sensor 52 in this seventh embodiment is movable by the sensor moving mechanism 58 in the right and left direction. The light receiving surface of the illuminance sensor 52 is directed rearward.

The mirror 76 is located at the reflection position except when the calibration is performed, and is located at the non-reflection position when the calibration is performed. In FIG. 27, the vertical distance L3 between the reflection surface of the mirror 76 located at the reflection position and the surface of the wafer W, and the horizontal distance L4 between the reflection surface and the light receiving surface of the illuminance sensor 52 are identical with each other. By setting the distances L3 and L4 according to the above, the illuminance of the light receiving surface of the illuminance sensor 52 is the same as the illuminance of the area (subarea) of which position with respect to the right and left direction is the same as the light receiving surface in the irradiation area 30. That is, similarly to the first embodiment, since the flood exposure module 81 can perform the calibration, deviation of the exposure amount in each portion of the wafer W from the set value can be prevented. Unlike the flood exposure module 73 in the sixth embodiment, it is not necessary for the flood exposure module 81 in this embodiment to rotate the LED group 47 and the lens 74, and thus, increase of height of the light source unit 40 can be advantageously avoided.

When the temperature of the illuminance sensor 52 increases by receiving the light, the detected value of illuminance lowers due to the aforementioned temperature drift. In order to prevent the temperature drift, a cooling unit for cooling the illuminance sensor 52 may be provided. To be specific, the illuminance sensor 52 may be provided with, as a cooling unit, a flow path to which a cooling liquid is supplied by a chiller, for example, so that the illuminance sensor 52 is cooled. In addition, although in the sixth and seventh embodiments the illuminance sensor 52 is arranged such that the distance between the LEDs 46 and the illuminance sensor 52 is the same as the distance between the LEDs 46 and the surface of the wafer W, the distance between the LEDs 46 and the illuminance sensor 52 may be set to be larger than the distance between the LEDs 46 and the surface of the wafer W in order to prevent temperature rising of the illuminance sensor 52. In this case, the illuminance of the irradiation area 30 may be calculated by multiplying a detected illuminance by a predetermined constant. Then, the aforementioned calibration and/or the feedback correction may be performed based on the calculated (corrected) illuminance.

In addition, in order to prevent temperature rising of the illuminance sensor 52 during the calibration, the following method may be used. That is, when the calibration is being performed, a current value to be supplied to each cell 4 is lowered by a predetermined amount than the set supply current value for the wafer W exposure, and under such a condition the illuminance distribution of the irradiation area 30 is measured. By correcting the thus obtained illuminance distribution by using the current-illuminance relationship described with reference to FIG. 10, it is possible to calculate an illuminance distribution of the irradiation area 30, which is to be obtained when each cell 4 is actually supplied with a current of the set supply current value. Instead of lowering the value of the current to be supplied to each cell 4 as mentioned above, the LEDs 46 may be subjected to a PWM control. In which case, the current is supplied to the LEDs 46 at a duty ratio of 100% when the wafer W is exposed. On the other hand, the current is supplied to the LEDs 46 at a lower duty ratio, e.g., 10% when the calibration is performed, and under such a condition illuminances of the respective subareas of the irradiation area 30 are obtained. By multiplying a predetermined constant to correct each illuminance thus obtained, it is possible to calculate the illuminance distribution that is to be obtained when the current is supplied to the LEDs 46 at a duty ratio of 100%.

Further, an ND (Neutral Density) filter may be provided to attenuate light emitted from the LEDs 46 to the illuminance sensor 52. By correcting the detected illuminance, the illuminance without the ND filter may be calculated. To be specific, the ND filter may be disposed between the cell 4-0 and the illuminance sensor 52 in the fourth embodiment. In this case, by multiplying the detected illuminance by a predetermined constant, it is possible to calculate the illuminance which is to be obtained without the ND filter. In addition, in the first embodiment, for example, the ND filter may be disposed on the fluorescent glass 54 in the sheath 53, so that ultraviolet light is transmitted from the cell 4 to the fluorescent glass 54 through the ND filter. Also in this case, by multiplying the detected illuminance by a predetermined constant, it is possible to calculate the illuminance which is to be obtained without the ND filter. By using the ND filter attenuating light, temperature rising of the illuminance sensor 52 can be suppressed.

( Eighth Embodiment )

A flood exposure module 9 in an eight embodiment is described with reference to FIG. 29 which is a vertically-sectioned side view and FIG. 30 which is a vertically-sectioned rear view. The description is made focusing mainly on a difference from the flood exposure module 3 in the first embodiment. Similarly to the flood exposure module 3, the flood exposure module 9 is configured to perform the calibration. The illuminance distribution detection unit 5 of the flood exposure module 9 includes the illuminance sensor 52, the arm 56, the moving mechanism 58 and a quartz rod 91 which is a light guide member. The arm 56 extends in the up and down direction. One end of the arm 56 is connected to the moving mechanism 58 in the case body 41 of the light source unit 40. The other end of the arm 56 supports the illuminance sensor 52 below the case body 41 such that the illuminance sensor 52 is disposed forward of the irradiation area 30. The illuminance sensor 52 is supported such that its light receiving surface for detecting the illuminance extends in the right and left direction. One end part of the quartz rod 91 is disposed to be overlapped with the light receiving surface, and the other end part of the quartz rod 91 extends rearward.

By the moving mechanism 58, the illuminance sensor 52 is moved outside the irradiation area 30 along the longitudinal direction of the irradiation area 30, and the quartz rod 91 is moved in the irradiation area 30 along the longitudinal direction of the irradiation area 30. Thus, the quartz rod 91 is configured to capable moving within a substrate moving path of the wafer W. When the calibration is performed, the quartz rod 91 is located in the irradiation area 30, so that the quartz rod 91 guides the light, which falls on the quartz rod 91 located in the irradiation area 30, to the illuminance sensor 52.

The quartz rod 91 is described with reference to FIG. 31 which is a side view and FIG. 32 which is a top view. In the side view, the quartz rod 91 has a shape of a right angled triangle narrowing rearward, which has a horizontal side and a side perpendicular thereto. An inclined surface, which rises as approaching rearward and forms a side of the right angled triangle, is denoted by reference sign 92. When viewed from above, the quartz rod 91 has substantially a rectangular shape elongated in the back and forth direction. The front end of the quartz rod 91 is cut off on a side opposed to the side facing the illuminance sensor 52 to define a pointed shape. Thus, the front end of the quartz rod 91 has an inclined surface that approaches the illuminance sensor 52 as going forward. The inclined surface is denoted by reference sign 93.

The upper surface of the quartz rod 91 is horizontal. An area of the upper surface forward of the rear edge serves as an incident surface 94 which allows light to be incident on the quartz rod 91. In order to detect the illuminance in the irradiation area 30, the incident surface 94 is located at the same height as the surface of the wafer W placed on a stage 33. Chain lines in FIGS. 29 and 30 show the heights of the surface of the wafer W and the incident surface 94. The length of the incident surface 94 with respect to the back and forth direction is longer than the length of the irradiation area 30 with respect to the back and forth direction. The front end of the incident surface 94 is located forward of the front end of the irradiation area 30, and the rear end of the incident surface 94 is located rearward of the rear end of the irradiation area 30.

The incident surface 94 is a frosted surface. That is, the incident surface 94 has fine irregularity. In FIG. 32, the frosted incident surface 94 is shaded. A side surface of the quartz rod 91, which overlaps with the light receiving surface of the illuminance sensor 52, serves as an emission surface 95 from which light is emitted from the quartz rod 91.

Figure 31:
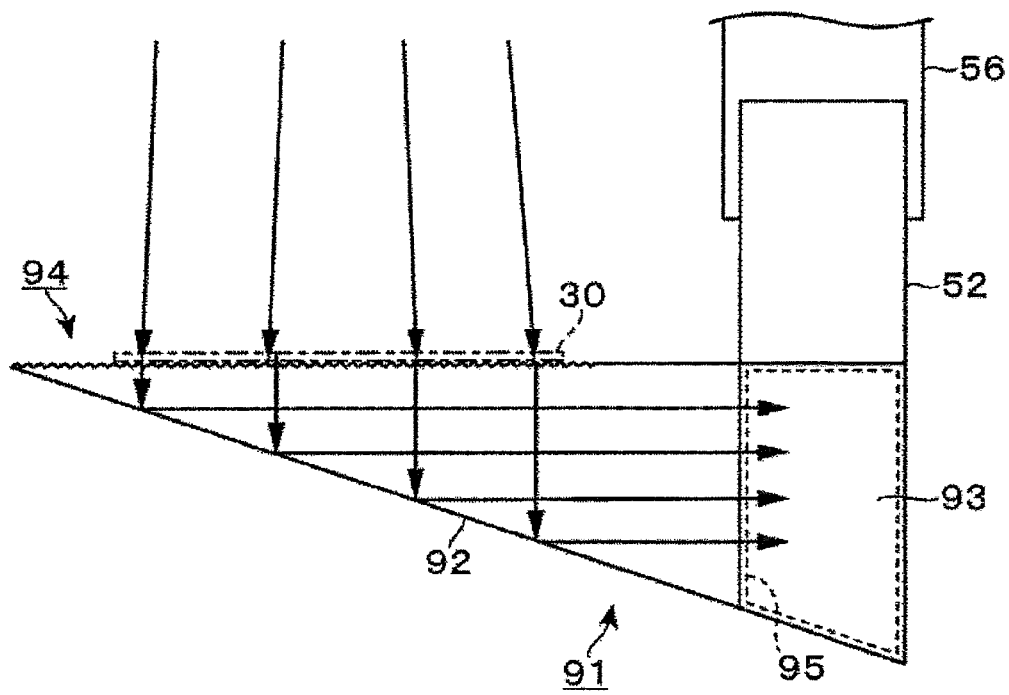
FIG. 31 is a side view of a quartz rod provided in the flood exposure module.
Figure 32:
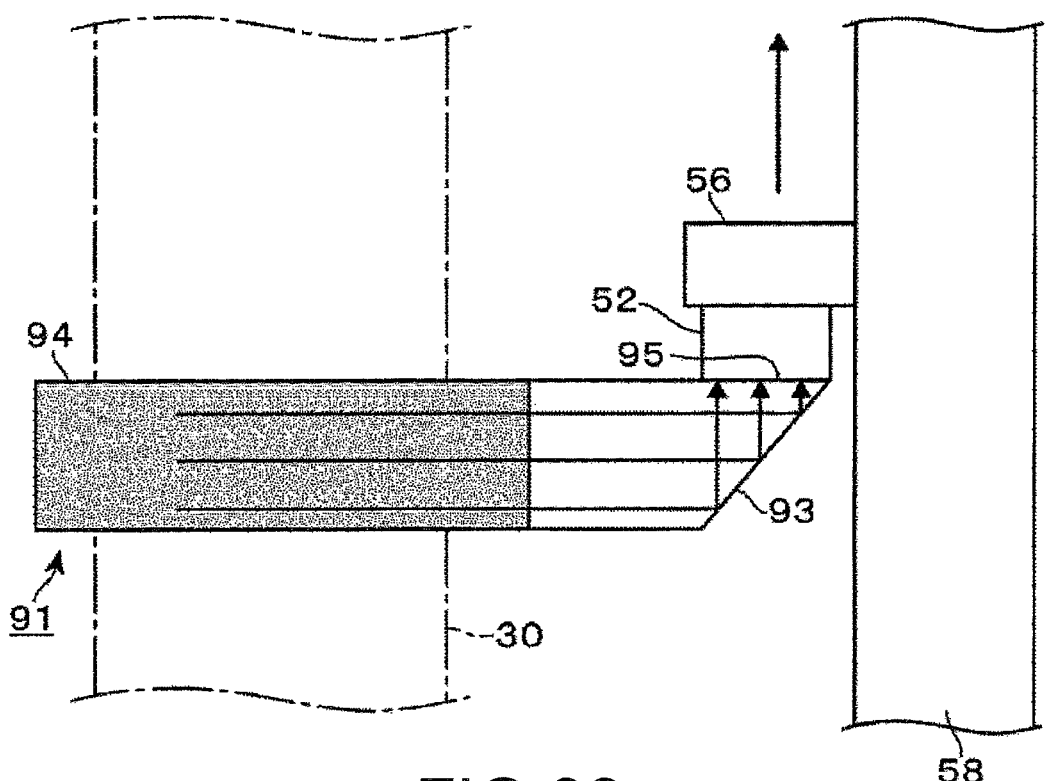
FIG. 32 is a top plan view of the quartz rod.

In FIGS. 31 and 32, the arrows show light paths in the quartz rod 91. When the incident surface 94 is located in the irradiation area 30, light falling on the quartz rod 91 is attenuated by the frosted incident surface 94, and then enters the quartz rod 91. The light is reflected by the inclined surface 92 in the quartz rod 91 to travel forward, and is reflected by the inclined surface 93 to travel laterally, so that the light receiving surface of the illuminance sensor 52 is irradiated with the light. In this manner, after the light has passed through the incident surface 94, the light is also attenuated until it reaches the illuminance sensor 52. Thus, the illuminance K2 (unit: $W/cm^2$) of the light receiving surface of the illuminance sensor 52 onto which the light is guided through the quartz rod 91 is smaller than the illuminance K1 (unit: $W/cm^2$)) of the irradiation area 30 in which the the the quartz rod 91 is located. For example, the illuminance K2 is not more than ½ of the illuminance K1. Since the illuminance K2 is lowered by the quartz rod 91, deterioration of the illuminance sensor 52 and deterioration of illuminance detection precision due to the aforementioned temperature drift (which may occur by illuminating the illuminance sensor 52 at a high illuminance) are prevented. In this case, the relationship between the illuminance K1 and the illuminance K2 may be grasped beforehand and may be stored in the memory 50 of the control board 49, in order to calculate the illuminance distribution of the irradiation area 30 based on the illuminance detection results.

Figure 29:
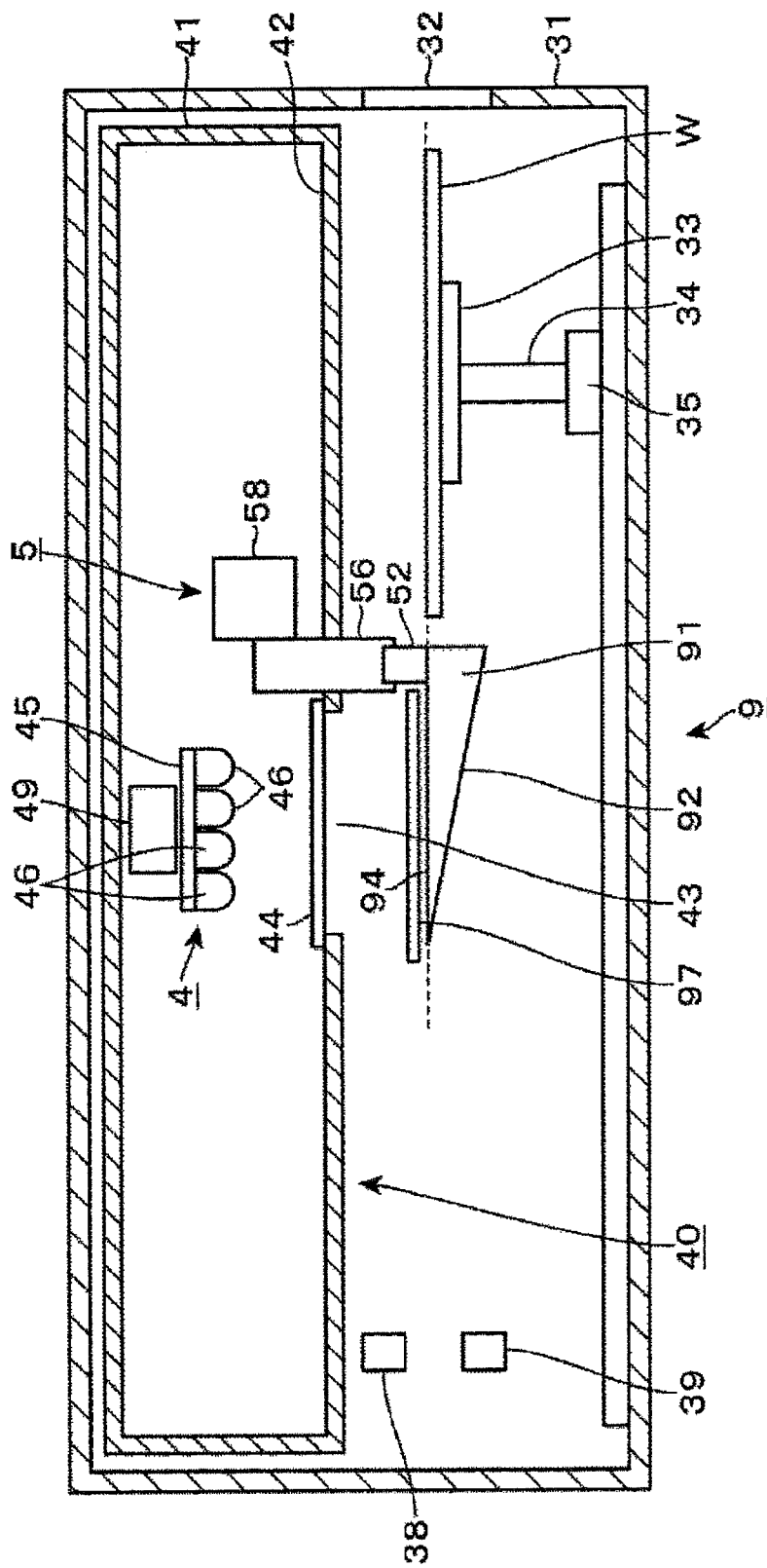
FIG. 29 is a vertically-sectioned side view of a flood exposure module in an eighth embodiment.
Figure 30:
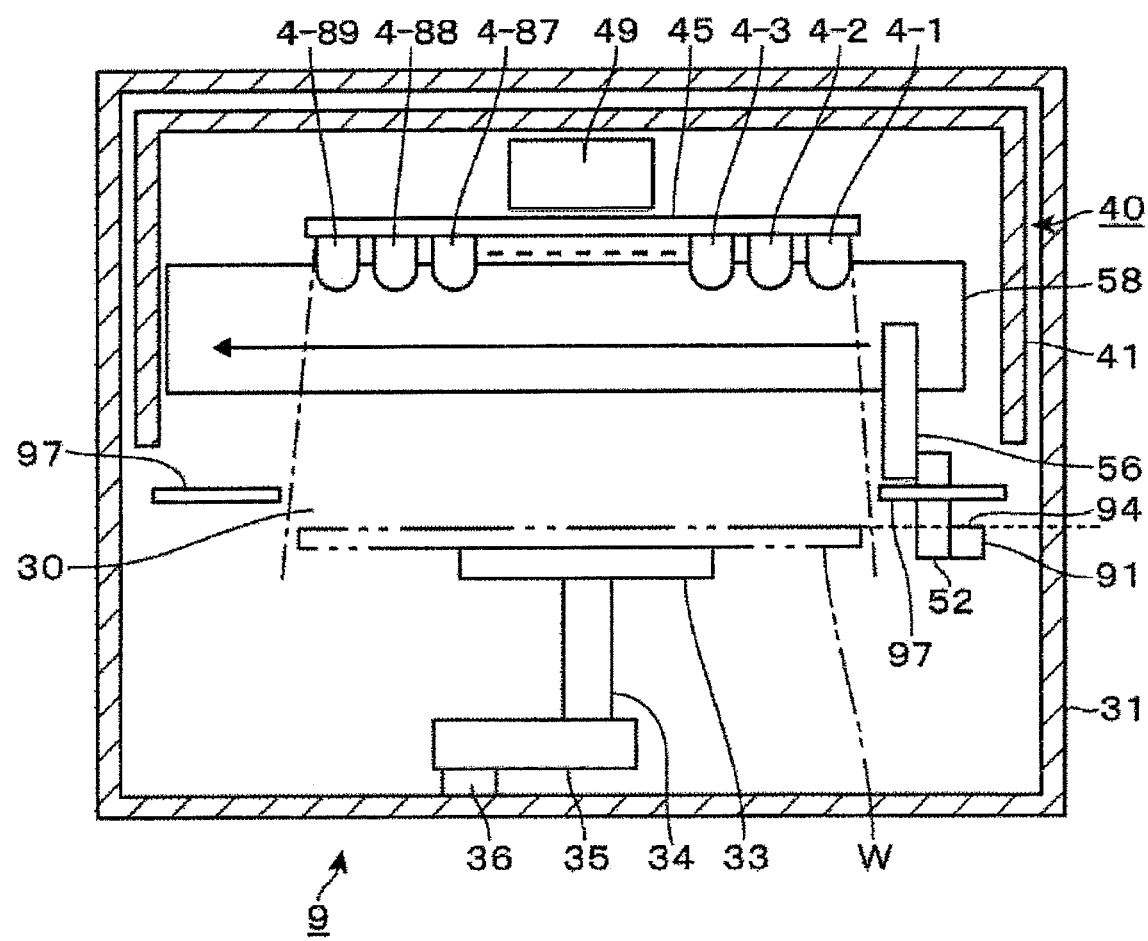
FIG. 30 is a vertically-sectioned rear view of the flood exposure module.

As shown in FIGS. 29 and 30, light shielding members 97 are provided on the right and left sides outside the irradiation area 30 and above the moving path of the quartz rod 91. When the quartz rod 91 is located directly below the light shielding member 97, the light shielding member 97 shields light so that the incident surface 94 of the quartz rod 91 is not irradiated with light emitted from the respective cells 4. An area directly below each light shielding member 97 is a standby area where the quartz rod 91 stands by when the calibration is not performed. FIG. 30 shows the quartz rod 91 located at the standby area.

The calibration is performed by moving the quartz rod 91 from one standby area to the other standby area. During the movement of the quartz rod 91, similarly to the calibration in the flood exposure module 3, current values outputted from the illuminance sensor 52 are obtained by the control board 49, and the illuminance values of the respective subareas of the irradiation area 30 are obtained. Since the illuminance values of the respective subareas obtained by the illuminance sensor 52 are smaller than the actual illuminance values of the respective subareas as described above, the obtained illuminance values are corrected by the control board 49 based on the aforementioned relationship between the illuminance K1 and the illuminance K2 so as to obtain the actual illuminance values of the respective subareas, i.e., an illuminance distribution of the irradiation area 30. Based on the thus obtained illuminance distribution, values of currents supplied to the respective cells 4 are updated in the same way as previously described in connection with the flood exposure module 3.

The structure of the light guide member is not limited to the forgoing embodiment. For example, the incident surface 94 of the rod 91 is frosted so as to function as an attenuation unit for attenuating the intensity of light transmitted to the illuminance sensor 52. However, the emission surface 95 may be frosted instead of the incident surface 94. In addition, the light guide member need not be composed of a single quartz rod 91 but may be composed of a plurality of quartz rods. In this case, incident surfaces and/or emission surfaces of the respective quartz rods may be frosted. Moreover, in a case where a plurality of quartz rods are provided, an ND filter serving as an attenuation unit may be disposed between the quartz rods, so as to make smaller the illuminance at the illuminance sensor 52.

In a case where a wafer W having a resist film formed thereon, which is not made of a photosensitized chemically amplified resist, is subjected to a process in the flood exposure module in each of the aforementioned embodiments, a resist pattern can be made uniform in a plane of the wafer W by optimizing the exposure amounts in respective portions. That is, the aforementioned flood exposure modules can be appropriately used for exposing the wafer W coated with a resist that is not of a chemically amplified type. Further, in a case where a resist film or an organic film other than the resist film that is hardened depending on the exposure amount is used, the film may be subjected to the process by the aforementioned flood exposure modules, so as to control a hardening degree of the film. Thus, the film can be etched uniformly in the plane of the wafer W in the etching process. That is, the present invention is not limited to the adjustment of CD of a resist pattern. Thus, the exposure apparatus in the present invention is not limited to an apparatus that exposes a resist, but may be a light irradiation apparatus of any type that that emits light to a substrate for a certain process.

As previously described in connection with the first embodiment, the flood exposure module 3 need not be disposed at the aforementioned position in a case where the CD of a resist pattern is adjusted. For example, a block (referred to as "intermediate block") having a transport mechanism for transferring the wafer W, the flood exposure module 3 and a transfer module may be disposed between the processing block D2 and the interface block D3. In this case, the wafer W having been subjected to a pattern exposure is transported from the interface block D3 to the transfer module TRS51, TRS61 of the tower T2. Thereafter, the transport mechanism of the intermediate block transports the wafer W to the flood exposure module 3, and then transports the wafer W to the transfer module in the intermediate block. The transfer arm F5 or F6 in the unit block E5 or E6 accesses that transfer module so that the wafer W is transported to the unit block E5 or E6, and is then subjected to the subsequent processes.

In addition, in the flood exposure module 3, the illuminance values are detected by moving the light guide unit relative to the LED group 47. However, a moving mechanism for moving the LED group 47 may be provided, and the illuminance values may be detected by moving the LED group 47 relative to the light guide unit 51. In addition, instead of moving the wafer W relative to the light source unit 40, the wafer W may be moved relative to the light source unit 40, when the wafer W is being exposed. In this specification, the expression "exposing the whole surface of a wafer W" means "exposing at least the whole device-forming area (i.e., an area where the semiconductor devices are formed) of the wafer W". Thus, the situation where the whole device-forming area of the wafer W is exposed while the peripheral portion of the wafer W outside the device-forming area is not exposed falls within the definition of the expression "exposing the whole surface of a (the) wafer W". It should be noted that the above-described various embodiments can be combined or modified.

As previously described with reference to FIG. 8, in the flood exposure module 3, the illuminance sensor 52 collectively receives the light falling on the whole length of the irradiation area 30 in the back and forth direction (i.e., the short dimension direction of the irradiation area 30) to measure an integrated illuminance value. That is, the illuminance sensor 52 does not measure illuminance values independently at different positions with respect to the back and forth direction. The reason why the integrated illuminance value is measured is that the variation in the illuminances with respect to the short dimension direction of the irradiation area 30 does not affect the flood exposure result as long as the integrated illuminance value conforms to the target value. More specifically, if the subareas B1 to B16 (see FIG. 11), which are obtained by dividing the irradiation area 30 in the longitudinal direction thereof, each have non-uniform illuminance distribution in the short dimension direction of the irradiation area 30, the flood exposure result is not affected by the non-uniform illuminance distribution itself. This is because, as described above, during the flood exposure, since the wafer W is moved along the short dimension direction of the irradiation area 30 to pass through the irradiation area 30, the exposure amount in each of the divided areas of the wafer W, which are defined by dividing the wafer W in the longitudinal direction of the irradiation area 30, correspond to the integrated illuminance value of the respective ones of divided areas of the irradiation area 30, which are defined by dividing the irradiation area 30 in the longitudinal direction of the irradiation area 30. Thus, as previously described in connection with the calibration of the flood exposure module 3, the exposure amounts of respective portions of the wafer W can be uniformized by the integrated illuminance values measured in the short dimension direction in the respective divided areas of the irradiation area 30.

Figure 33:
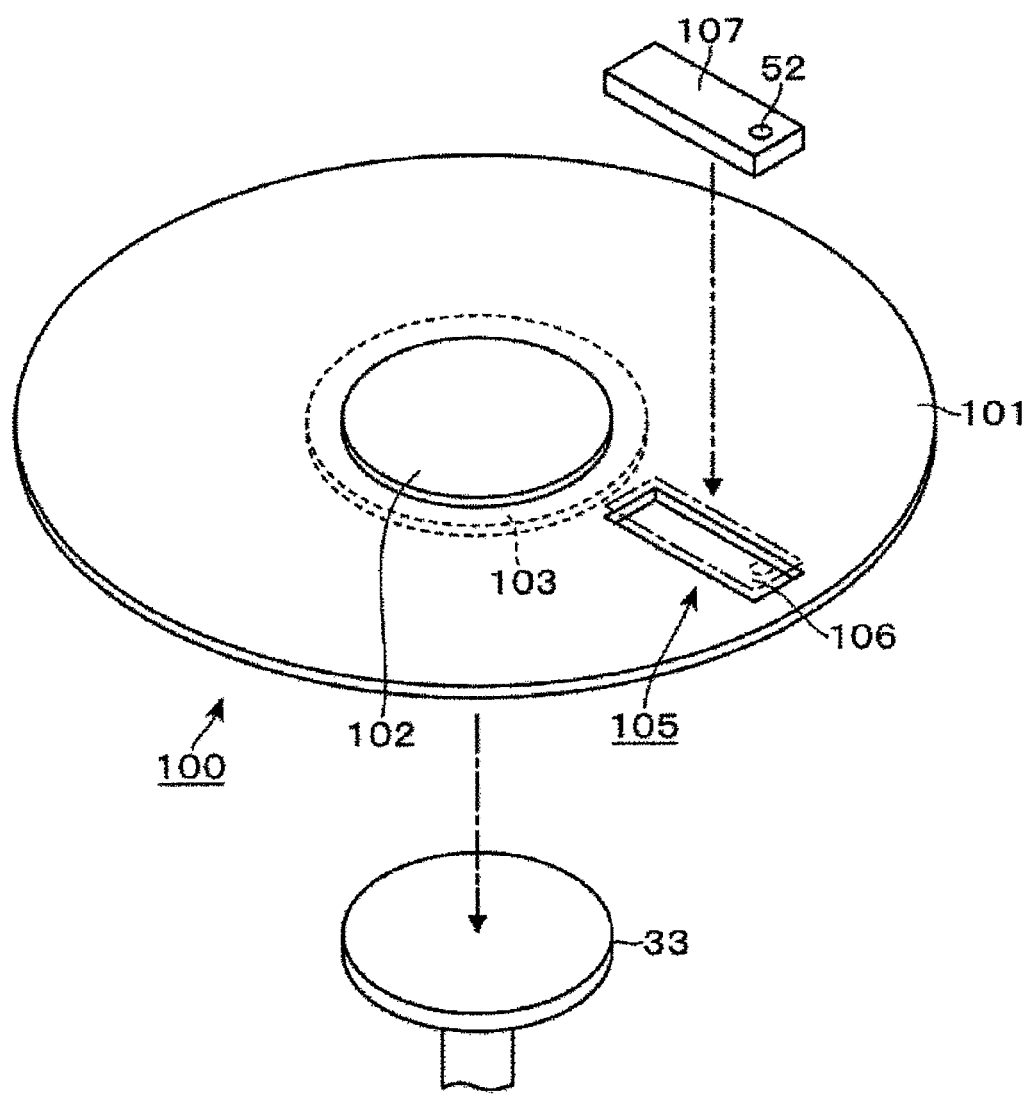
FIG. 33 is a perspective view of a jig used in the flood exposure module.
Figure 34:
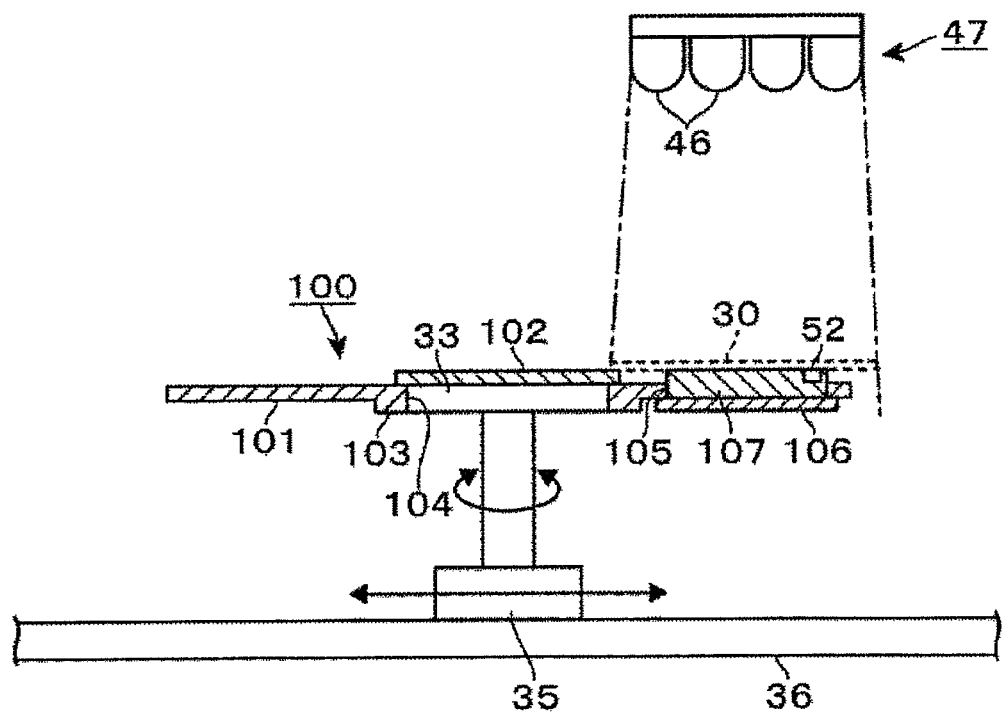
FIG. 34 is a vertically-sectioned side view of the jig.
Figure 35:
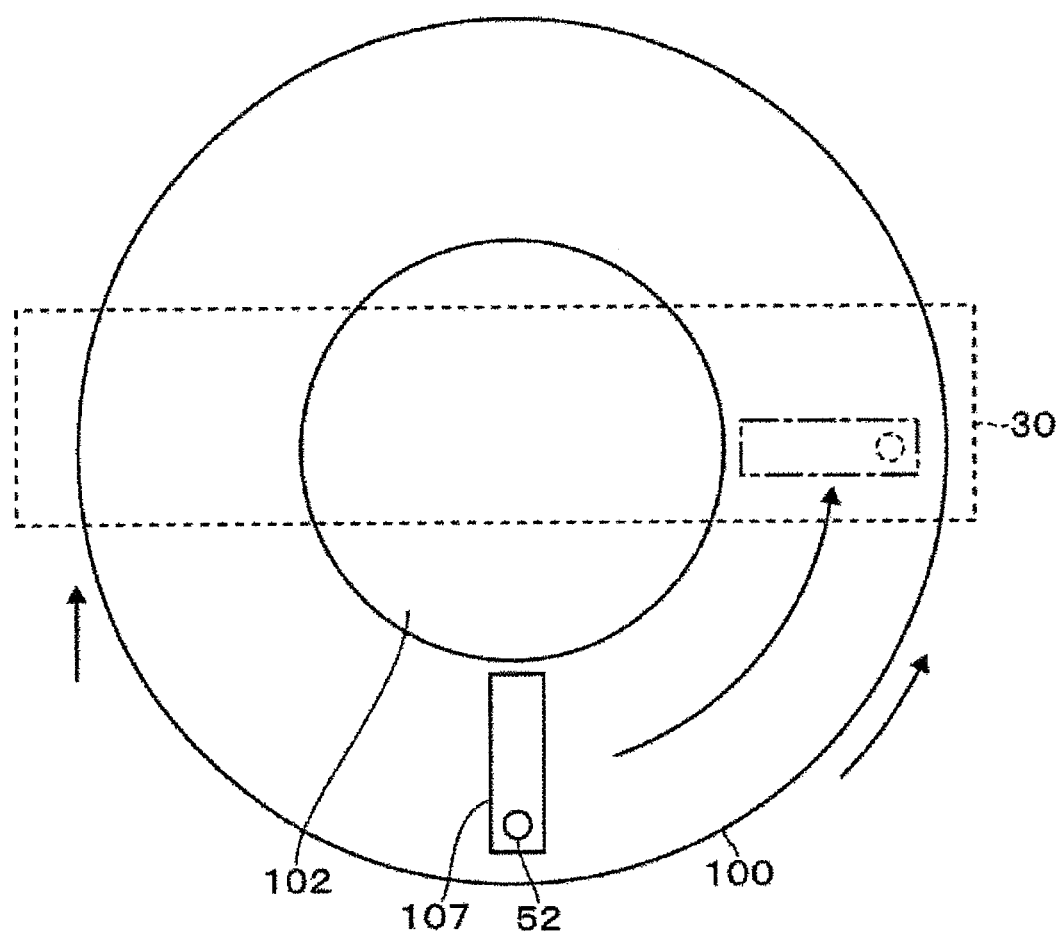
FIG. 35 is a top plan view of the jig.

In the aforementioned embodiments, the illuminance of the irradiation area 30 is measured by the illuminance sensor 52 which is a light receiving unit disposed in the module. Alternatively, the illuminance may be measured by using a jig that is separated from the module. FIGS. 33, 34 and 35 are a perspective view, a vertically-sectioned side view and a plan view of the jig 100 for illuminance measurement. The jig 100 has a circular jig body 101 having the same shape and size of as those of the wafer W in a plan view. A through-hole is formed in a central part of the jig body 101. A closure plate 102 that closes the through-hole from above is attached to the jig body 101. An annular projection 103 is provided on a lower side of the jig body 101 to extend along a periphery of the through-hole. A recess 104 is defined by the annular projection 103, a sidewall forming the through-hole and the closure plate 102. The lower surface of the closure plate 102 can be placed on the stage 33 of each flood exposure module, with the stage 33 being fitted in the recess 104 and the jig body 101 being supported by the stage 33 horizontally.

The jig body 101 has an elongate slit extending from the central side to the peripheral side. A closure member 106 is provided to close the slit from below so as to form a measuring instrument placement recess 105. An elongated measurement instrument 107 is removably disposed in the recess 105. The measurement instrument 107 includes an illuminance sensor 52 and a not-shown memory that stores an illuminance detected by the illuminance sensor 52. A light receiving surface of the illuminance sensor 52 has a circular shape of a small diameter, and faces upward. For example, the center of the light receiving surface is distant from the center of the jig body 101 by 140 mm. As shown in FIG. 34, when the jig 100 is placed on the stage 33, the light receiving surface is located at the same height as that of the irradiation area 30. As shown by the arrows in FIGS. 34 and 35, the light receiving surface of the illuminance sensor 52 can be moved along the irradiation area 30 by the rotation and the back and forth movement of the stage 33, so as to obtain the illuminance values of respective portions in the irradiation area 30.

A procedure of detecting the illuminance by using the jig 100 in the flood exposure module having the same structure as that of the flood exposure module 3 described with reference to FIG. 3, etc., excluding that the illuminance distribution detection unit 5 is not provided, is described. It is assumed that the user can operate the flood exposure module through the control unit 10, and can manually control operations of the respective units/devices of the flood exposure module. Firstly, the user places the jig 100 on the stage 33 on which no wafer W is placed, such that the jig 100 is directed in a predetermined orientation. Then, the user operates the module such that the jig 100 is sucked from a suction hole (not shown) for suctioning the wafer W disposed on the upper surface of the stage 33, so as to fix the jig 100 onto the stage 33. Thereafter, the illuminance sensor 52 is moved to a given position in the irradiation area 30 by the rotation and the back and forth movement of the stage 33. By repeating the rotation and the back and forth movement, the illuminance values of desired positions are measured. Simultaneously with the measurement of the illuminance values, the control unit 10 obtains data about the orientations and the positions of the stage 33 in the back and forth direction at respective timings. After that, the sucking of the stage 33 is stopped, and the jig 100 is removed from the stage 33. In addition, the measurement instrument 107 is removed from the jig body 101 and is connected to a computer to obtain illuminance data. By comparing the illuminance data and the data obtained by the control unit 10 with each other, the illuminance values of respective portions in the irradiation area 30 are obtained.

The illuminance of a specific local point in the irradiation area 30 may be obtained by the jig 100. Similarly to the flood exposure modules 3 and 61, the illuminance distribution may be obtained by obtaining the illuminance values of respective points between one end and the other end of the irradiation area 30, and the light quantities outputted from the respective cells 4 may be adjusted based on the illuminance distribution. When the illuminance distribution is obtained, the illuminance sensor 52 may be moved from a central part to the one end of the irradiation area 30 in the longitudinal direction, and then the illuminance sensor 52 may be moved from the central part to the other end. That is, the movement of the illuminance sensor 52 for obtaining the illuminance distribution is not limited to that in the foregoing embodiments in which the illuminance sensor 52 is moved from one end to the other end of the irradiation area 30. Similarly to the case in which the illuminance sensor 52 is attached to the stage 33 through an arm and the jig 100 is used by the rotation and the back and forth movement of the stage 33, the illuminance values may be detected by moving the illuminance sensor 52 to respective points in the irradiation area 30. Also when the illuminance values of the irradiation area 30 are detected through the rotation and the back and forth movement of the stage 33, the illuminance sensor 52 may be provided in the module.

What is claimed is:

1. An exposure apparatus comprising:
    a stage on which a substrate is placed;
    a plurality of light irradiation units configured to emit light independently of each other to different positions in a right and left direction on a surface of the substrate, so as to form a strip-like irradiation area extending from one end to the other end of the surface of the substrate in the right and left direction;
    a stage moving mechanism configured to move the stage in a first area between a first end portion, where the substrate is transferred from an external transfer arm to the stage, and a second end portion, where a detection device is provided to detect an orientation of the substrate placed on the stage, and in a back and forth direction relative to the irradiation area;
    a light-shielding partitioning wall disposed between the first area, where the stage moving mechanism moves the stage carrying the substrate between the first end portion and the second end portion, and a second area, where the irradiation area is provided, the light-shielding partitioning wall has an opening at an intermediate portion of the light-shielding partitioning wall so as to be between the first end portion and the second end portion in the first area, and adjacent to the irradiation area in the second area;
    a shutter configured to close the opening;
    a shutter moving mechanism configured to move the shutter between a closed position, which closes the opening, and an opened position, which opens the opening;
    a controller configured to transmit control signals that make the exposure apparatus perform (i) a step that moves the substrate from the first end portion to the second end portion such that when the substrate is at the second end portion the shutter is moved from the closed position to the opened position, (ii) a step that moves the substrate from the second end portion to the first end portion so as to expose the whole surface of the substrate to the irradiation area, (iii) a step that moves the shutter to the closed position when the substrate is at the first end portion and then unload the substrate from the first end portion via the external transfer arm and (iv) a step that moves the shutter to the opened position when the substrate is not in the first area so as to expose the irradiation area to a light receiving unit;
    the light receiving unit configured to detect an illuminance distribution of the irradiation area in the right and left direction of the irradiation area; and
    a light receiving unit moving mechanism configured to move the light receiving unit within the irradiation area between one end and the other end of the irradiation area in the right and left direction in order to allow the light receiving unit to detect the illuminance distribution of the irradiation area,
    wherein the light receiving unit and the light receiving unit moving mechanism are separated from the stage and the stage moving mechanism such that movement of the stage will not result in any movement of the light receiving unit.

2. The exposure apparatus according to claim 1, further comprising an adjustment unit configured to adjust a light quantity emitted from each of the light irradiation units for exposing the substrate, based on the illuminance distribution detected by the light receiving unit.

3. The exposure apparatus according to claim 1, wherein the light receiving unit is configured to be moved by the stage moving mechanism in a substrate moving path along which the substrate is moved.

4. The exposure apparatus according to claim 1, wherein the light receiving unit includes:
    a wavelength conversion member configured to move in a substrate moving path along which the substrate is moved, and configured to convert wavelength spectrum of the light received by the wavelength conversion member,
    said apparatus further comprising an illuminance detection unit to which the light, whose wavelength spectrum is converted by the wavelength conversion member, is guided, so as to detect an illuminance on the wavelength conversion member.

5. The exposure apparatus according to claim 4, wherein the light receiving unit includes a light shielding unit having an opening formed therein, in order to partially shield the light travelling from the light irradiation units to the wavelength conversion member.

6. The exposure apparatus according to claim 5, wherein the opening has a shape of a slit whose short dimension direction corresponds to the right and left direction.

7. The exposure apparatus according to claim 1, wherein the light receiving unit includes a light guide member configured to move in a substrate moving path along which the substrate is moved,
    said apparatus further comprising an illuminance detection unit configured to detect an illuminance of the light guided by the light guide member, the light guide member including an attenuation unit configured to attenuate an intensity of the light guided to the illuminance detection unit.

8. The exposure apparatus according to claim 7, wherein the light guide member is formed of a quartz rod, and at least one of an incident surface of the quartz rod, onto which the light is incident, and an emission surface of the quartz rod, from which the light is emitted, is frosted to form the attenuation unit.

9. The exposure apparatus according to claim 1, further comprising a monitoring light irradiation unit in addition to the the plurality of light irradiation units, wherein the substrate is not irradiated with light emitted from the monitoring light irradiation unit,
    wherein the illuminance detection unit selectively receives light emitted from the plurality of light irradiation units or from the monitoring light irradiation unit, and wherein the adjustment unit is configured to collectively adjust the light quantities outputted from the light irradiation units for exposing the substrate, based on an illuminance of the light emitted from the monitoring light irradiation unit to the illuminance detection unit.

10. The exposure apparatus according to claim 1, further comprising a light path changing mechanism configured to change a light path formed by each light irradiation unit, between a case when the substrate is exposed and a case when light is emitted to the illuminance detection unit.

11. The exposure apparatus according to claim 10, wherein the light path changing mechanism is a light irradiation unit moving mechanism configured to move the light irradiation units so as to change a direction of the light emitted from the light irradiation units.

12. The exposure apparatus according to claim 10, wherein the light path changing mechanism includes a reflection member configured to reflect light emitted from the respective light irradiation units, and a positon changing mechanism configured to change a position of the reflection member.

13. The exposure apparatus according to claim 1, wherein said apparatus is used for exposing the substrate on which a resist film having been subjected to a pattern exposure using a pattern mask is formed.

14. The exposure apparatus according to claim 1, wherein the substrate is a circular substrate, and wherein the stage is provided with a rotary driving unit configured to drive the substrate placed on the stage for rotation,
the exposure apparatus further comprising an orientation adjusting unit including:
the detection device configured to detect the orientation of the substrate placed on the stage; and
a control device configured to control the rotary driving unit to rotate the stage based on detection result of the detection device to direct the substrate in a predetermined orientation for exposure,
wherein the light irradiation units and the detection device are located at different positions in the exposure apparatus with respect to the back and forth direction such that the substrate is placed at different positions when the substrate is being exposed and when the orientation of the substrate is being adjusted.

15. The exposure apparatus according to claim 1, wherein the irradiation area has a width in the back and forth direction, wherein the light receiving unit has a length in the back and forth direction, wherein the length of the light receiving unit is not smaller than the width of the irradiation area, whereby the whole irradiation area can be scanned by the light receiving unit by moving the light receiving unit from the one end to the other end of the irradiation area in the right and left direction only once.

16. A method of operating an exposure apparatus, comprising:
a step that places a substrate on a stage;
a step that makes a plurality of light irradiation units emit light independently of each other to different positions in a right and left direction on a surface of the substrate, so as to form a strip-like irradiation area extending from one end to the other end of the surface of the substrate in the right and left direction;
a step that moves the stage carrying the substrate in a first area between a first end portion, where the substrate is transferred from an external transfer arm to the stage, and a second end portion, where a detection device is provided to detect an orientation of the substrate placed on the stage, and in a back and forth direction relative to the irradiation area by means of a stage moving mechanism;
a step that moves a shutter, which is configured to close an opening in a light-shielding partitioning wall, between a closed position, which closes the opening, and an opened position, which opens the opening, the light-shielding partitioning wall is disposed between the first area, where the stage carrying the substrate moves between the first end portion and the second end portion, and a second area in which the irradiation area is provided, the opening is at an intermediate portion of the light-shielding partitioning wall so as to be between the first end portion and the second end portion in the first area, and adjacent to the irradiation area in the second area;
a step of moving the substrate from first end portion to the second end portion, and when the substrate is at the second end portion moving the shutter from the closed position to the opened position;
a step of moving the substrate from the second end portion to the first end portion thereby exposing the whole surface of the substrate to the irradiation area;
a step of moving the shutter to the closed position when the substrate is at the first end portion and then unloading the substrate from the first end portion via the external transfer arm;
a step of moving the shutter from the closed position to the opened position when the substrate is not in the first area thereby exposing the irradiation area to a light receiving unit;
a step that moves the light receiving unit between one end and the other end of the irradiation area in the right and left direction by means of a light receiving unit moving mechanism to allow the light receiving unit to receive the light, in order to detect an illuminance distribution of the irradiation area in the right and left direction of the irradiation area; and
a step that adjusts a light quantity emitted from each of the light irradiation units for exposing the substrate, based on the illuminance distribution thus detected,
wherein the light receiving unit and the light receiving unit moving mechanism are separated from the stage and the stage moving mechanism such that movement of the stage will not result in any movement of the light receiving unit.

17. The method according to claim 16, further comprising a step that places a jig having the light receiving unit on the stage on which the substrate is not placed, wherein the step that moves the light receiving unit includes a step that rotates the stage on which the jig is placed, and a step that moves the stage in the back and forth direction relative to the light irradiation area.

18. A non-transitory storage medium storing a computer program for use in an exposure apparatus for exposing a substrate, wherein the computer program includes steps for executing the method according to claim 16.

19. The method according to claim 16, wherein the substrate is a circular substrate, and wherein the stage is provided with a rotary driving unit configured to drive the substrate placed on the stage for rotation,
the method further comprising:
a step that adjusts the orientation of the substrate by means of an orientation adjusting unit, which includes the detection device configured to detect the orientation of the substrate placed on the stage, and a control device configured to control the rotary driving unit to rotate the stage based on detection result of the detection device to direct the substrate in a predetermined orientation for exposure,
wherein the light irradiation units and the detection device are located at different positions in the exposure apparatus with respect to the back and forth direction such that the substrate is placed at different positions when the substrate is being exposed and when the orientation of the substrate is being adjusted.

20. The method according to claim 16, wherein the irradiation area has a width in the back and forth direction, and wherein the light receiving unit has a length in the back and forth direction, wherein the length of the light receiving unit is not smaller than the width of the irradiation area, whereby the whole irradiation area can be scanned by the light receiving unit by moving the light receiving unit from the one end to the other end of the irradiation area in the right and left direction only once.

\* \* \* \* \*